United States Patent
Ferguson et al.

(10) Patent No.: US 8,072,333 B2
(45) Date of Patent: *Dec. 6, 2011

(54) RFID DEVICE AND METHOD OF FORMING

(75) Inventors: Scott Wayne Ferguson, Pasadena, CA (US); David N. Edwards, La Canada, CA (US); Peikang Liu, Claremont, CA (US); Jason Munn, West Covina, CA (US); Ian J. Forster, Chelmsford (GB); Samuel A. Linder, Moore, SC (US); Thomas Craig Weakley, Simpsonville, SC (US); David Puleston, Duluth, GA (US); Steven C. Kennedy, Fontana, CA (US); Christine U. Dang, Garden Grove, CA (US)

(73) Assignee: Avery Dennison Corporation, Pasadena, CA (US)

( * ) Notice: Subject to any disclaimer, the term of this patent is extended or adjusted under 35 U.S.C. 154(b) by 1135 days.

This patent is subject to a terminal disclaimer.

(21) Appl. No.: 11/752,482

(22) Filed: May 23, 2007

(65) Prior Publication Data

US 2007/0216534 A1    Sep. 20, 2007

Related U.S. Application Data

(60) Division of application No. 10/871,169, filed on Jun. 18, 2004, now Pat. No. 7,224,280, which is a continuation-in-part of application No. 10/334,290, filed on Dec. 31, 2002, now Pat. No. 6,940,408, and a continuation-in-part of application No. PCT/US03/41534, filed on Dec. 31, 2003.

(51) Int. Cl.
*G08B 13/14*    (2006.01)

(52) U.S. Cl. ............... 340/572.7; 340/572.1; 340/572.4; 340/572.8; 235/492; 343/702; 29/829

(58) Field of Classification Search ............... 340/572.8, 340/572.1, 572.7; 343/799 MS, 873, 895; 438/128; 361/736; 29/829
See application file for complete search history.

(56) References Cited

U.S. PATENT DOCUMENTS 4,783,646 A    11/1988   Matsuzaki
(Continued)

FOREIGN PATENT DOCUMENTS

DE    19732644    11/1998
(Continued)

OTHER PUBLICATIONS

Wernle, Michael E. Dr., "Manufacturing of Low Cost Smart Labels", NanoPierce Card Technologies GmbH, presented at IMAPS, Boston Massachusetts, Sep. 2000.

*Primary Examiner* — Daniel Wu
*Assistant Examiner* — Son M Tang

(57) ABSTRACT

A radio frequency identification (RIFD) inlay includes an electrical connection between a chip and an antenna. The electrical connection includes conductive interposer leads and a capacitive connection. The capacitive connection may involve putting the antenna and the interposer leads into close proximity, with dielectric pads therebetween, to allow capacitive coupling between the antenna and the interposer leads. The dielectric pads may include a non-conductive adhesive and a high dielectric material, such as a titanium oxide. The connections provide a convenient, fast, and effective way to operatively couple antennas and interposers. The RFID inlay may be part of an RFID label or RFID tag.

19 Claims, 13 Drawing Sheets

U.S. PATENT DOCUMENTS

| | | | |
|---|---|---|---|
| 4,898,323 | A | 2/1990 | Chen et al. |
| 5,153,983 | A | 10/1992 | Oyama |
| 5,528,222 | A | 6/1996 | Moskowitz et al. |
| 5,545,291 | A | 8/1996 | Smith et al. |
| 5,564,888 | A | 10/1996 | Doan |
| 5,781,110 | A | 7/1998 | Habeger, Jr. et al. |
| 5,783,856 | A | 7/1998 | Smith et al. |
| 5,786,626 | A | 7/1998 | Brady et al. |
| 5,824,186 | A | 10/1998 | Smith et al. |
| 5,904,545 | A | 5/1999 | Smith et al. |
| 6,091,332 | A | 7/2000 | Eberhardt et al. |
| 6,100,804 | A | 8/2000 | Brady et al. |
| 6,107,920 | A | 8/2000 | Eberhardt et al. |
| 6,121,880 | A | 9/2000 | Scott et al. |
| 6,145,901 | A | 11/2000 | Rich |
| 6,177,859 | B1 | 1/2001 | Tuttle et al. |
| 6,181,287 | B1 | 1/2001 | Beigel |
| 6,206,292 | B1 | 3/2001 | Robertz et al. |
| 6,215,401 | B1 | 4/2001 | Brady et al. |
| 6,246,327 | B1 | 6/2001 | Eberhardt |
| 6,259,408 | B1 | 7/2001 | Brady et al. |
| 6,262,292 | B1 | 7/2001 | Yasuda et al. |
| 6,265,977 | B1 | 7/2001 | Vega et al. |
| 6,274,508 | B1 | 8/2001 | Jacobsen et al. |
| 6,281,038 | B1 | 8/2001 | Jacobsen et al. |
| 6,376,769 | B1 * | 4/2002 | Chung ............................ 174/524 |
| 6,451,154 | B1 | 9/2002 | Grabau et al. |
| 6,456,256 | B1 * | 9/2002 | Amundson et al. ........... 343/873 |
| 6,518,885 | B1 | 2/2003 | Brady et al. |
| 6,606,247 | B2 | 8/2003 | Credelle et al. |
| 6,624,362 | B2 | 9/2003 | Muller |
| 6,630,203 | B2 | 10/2003 | Bahn et al. |
| 6,665,193 | B1 | 12/2003 | Chung et al. |
| 6,667,092 | B1 * | 12/2003 | Brollier et al. ................. 428/182 |
| 6,683,254 | B1 | 1/2004 | Gunnels |
| 6,786,419 | B2 | 9/2004 | Kayanakis |
| 6,796,508 | B2 | 9/2004 | Muller |
| 6,951,596 | B2 | 10/2005 | Green et al. |
| 6,985,361 | B2 * | 1/2006 | Credelle et al. ............... 361/736 |
| 7,154,046 | B2 * | 12/2006 | Chung ............................ 174/259 |
| 7,214,569 | B2 * | 5/2007 | Swindlehurst et al. ....... 438/125 |
| 2001/0053675 | A1 | 12/2001 | Plettner |
| 2001/0054755 | A1 | 12/2001 | Kirkham |
| 2002/0027294 | A1 | 3/2002 | Newhaus et al. |
| 2003/0136503 | A1 | 7/2003 | Green et al. |
| 2003/0232174 | A1 | 12/2003 | Chang et al. |
| 2004/0041262 | A1 | 3/2004 | Okamoto et al. |
| 2004/0052202 | A1 | 3/2004 | Brollier |
| 2004/0052203 | A1 | 3/2004 | Brollier |
| 2004/0125040 | A1 | 7/2004 | Ferguson et al. |
| 2004/0183182 | A1 | 9/2004 | Swindlehurst et al. |
| 2004/0188531 | A1 | 9/2004 | Gengel et al. |

FOREIGN PATENT DOCUMENTS

| | | |
|---|---|---|
| DE | 10120269 | 4/2001 |
| DE | 10108080 | 4/2002 |
| DE | 10133588 | 9/2002 |
| EP | 1039543 | 9/2000 |
| EP | 1267303 | 12/2002 |
| EP | 1420477 | 5/2004 |
| JP | 2002308437 | 10/2002 |
| JP | 2003223626 | 8/2003 |
| JP | 2003242471 | 3/2008 |
| WO | 8200541 | 2/1982 |
| WO | 9808191 | 2/1998 |
| WO | 0016277 | 3/2000 |
| WO | 0016286 | 3/2000 |
| WO | 0033621 | 6/2000 |
| WO | 0045353 | 8/2000 |
| WO | 0046854 | 8/2000 |
| WO | 0049421 | 8/2000 |
| WO | 0049648 | 8/2000 |
| WO | 0052109 | 9/2000 |
| WO | 0055915 | 9/2000 |
| WO | 0055916 | 9/2000 |
| WO | 0133621 | 5/2001 |
| WO | 0150547 | 7/2001 |
| WO | 0153675 | 7/2001 |
| WO | 0171686 | 9/2001 |
| WO | 0175832 | 10/2001 |
| WO | 0225825 | 3/2002 |
| WO | 0235289 | 5/2002 |
| WO | 02097723 | 12/2002 |
| WO | 03056509 | 7/2003 |
| WO | 03068874 | 8/2003 |
| WO | 2004017439 | 2/2004 |
| WO | 2004044834 | 5/2004 |
| WO | 2004046762 | 6/2004 |
| WO | 2004049247 | 6/2004 |
| WO | 2004051559 | 6/2004 |
| WO | 2004053721 | 6/2004 |
| WO | 2004061753 | 7/2004 |

* cited by examiner

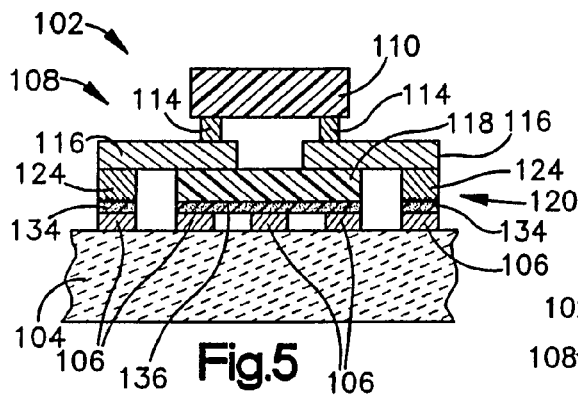
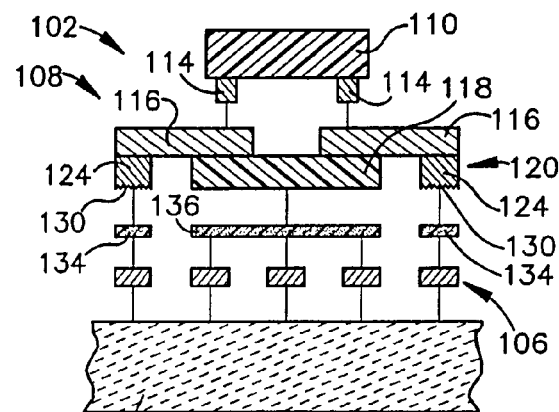
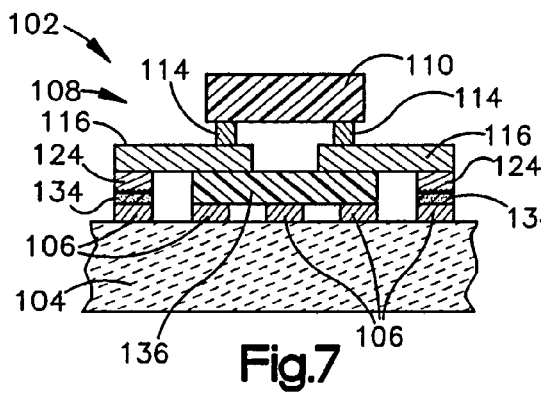
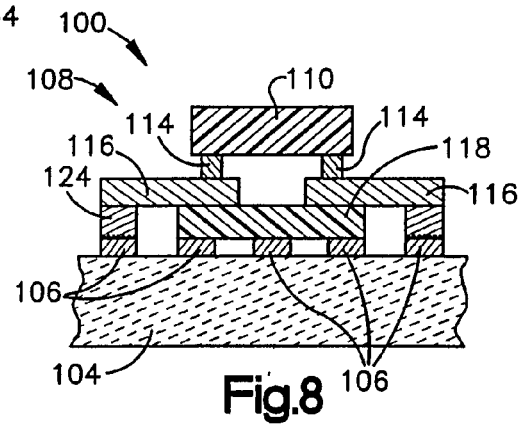
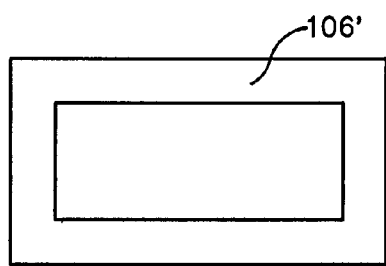
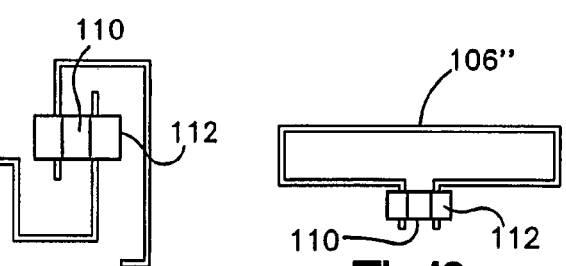

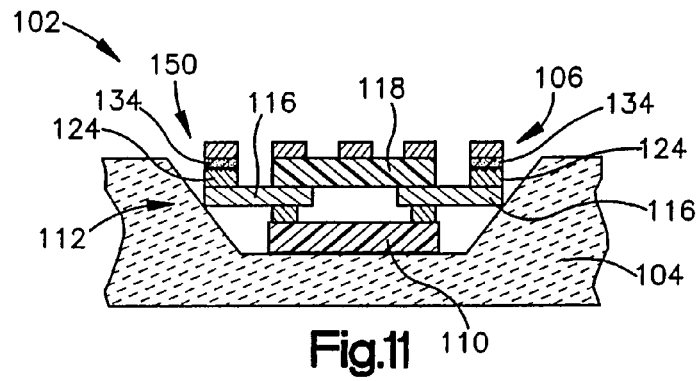
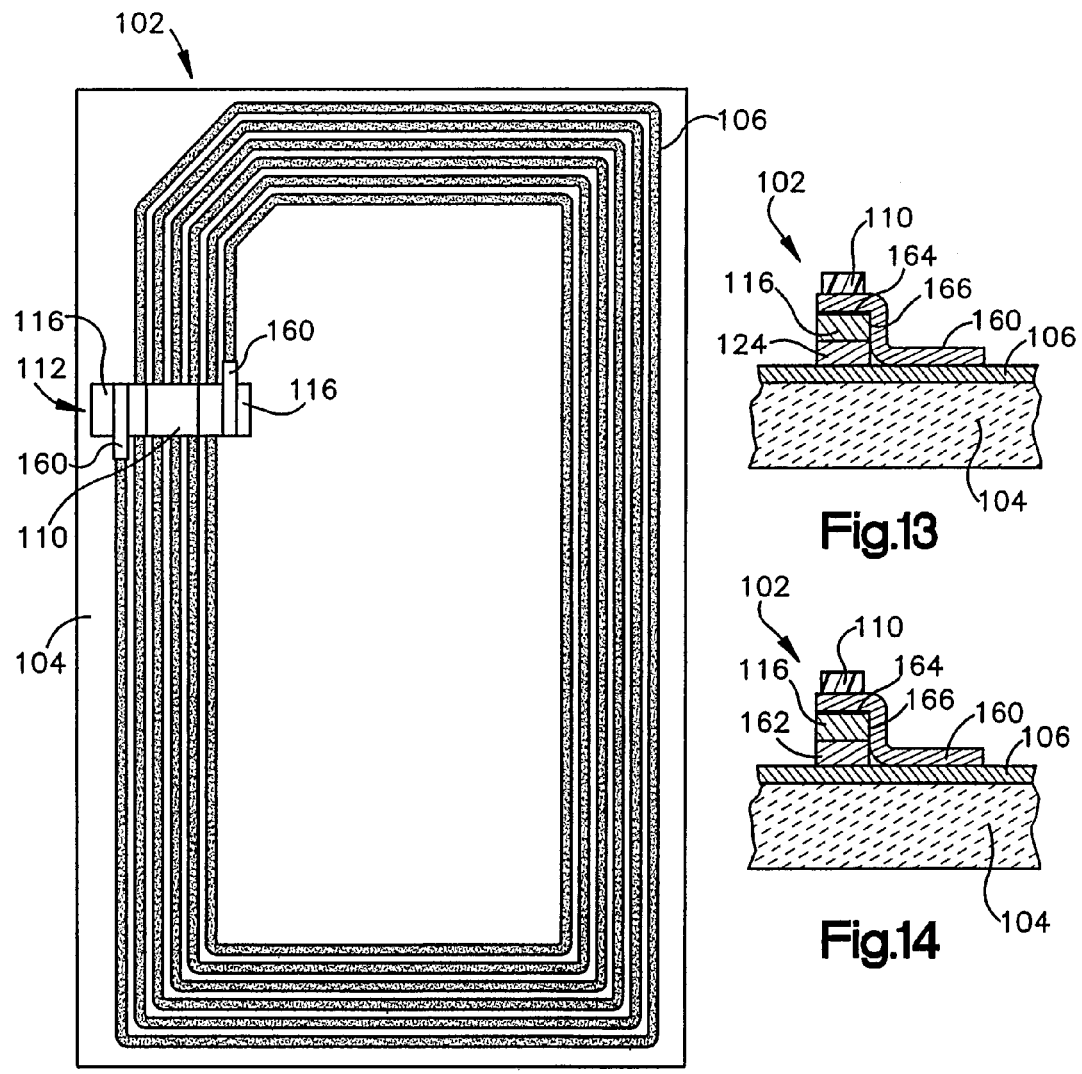

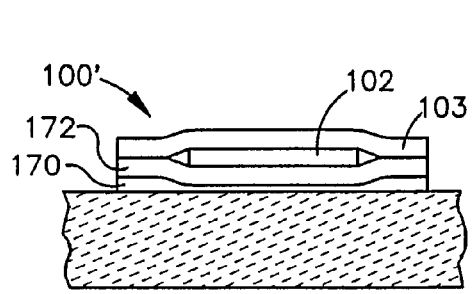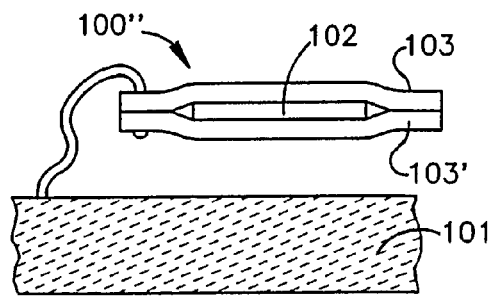
Fig.15   Fig.16
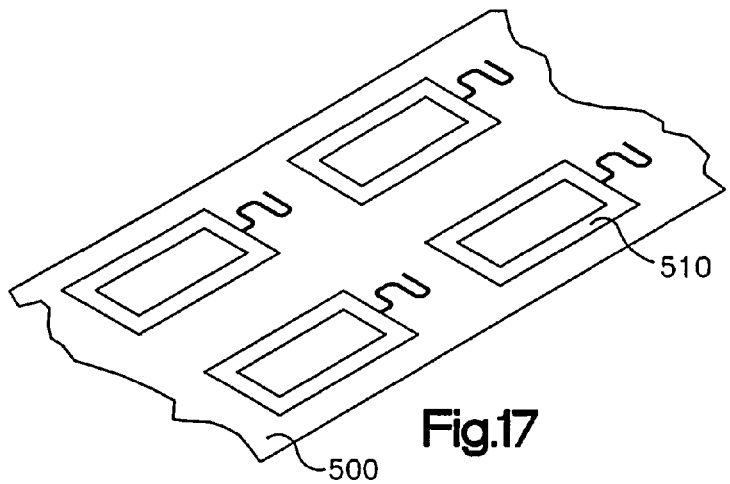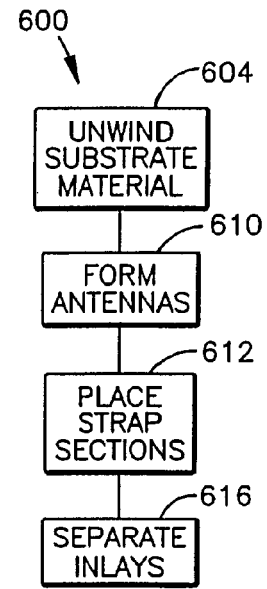
Fig.17   Fig.19
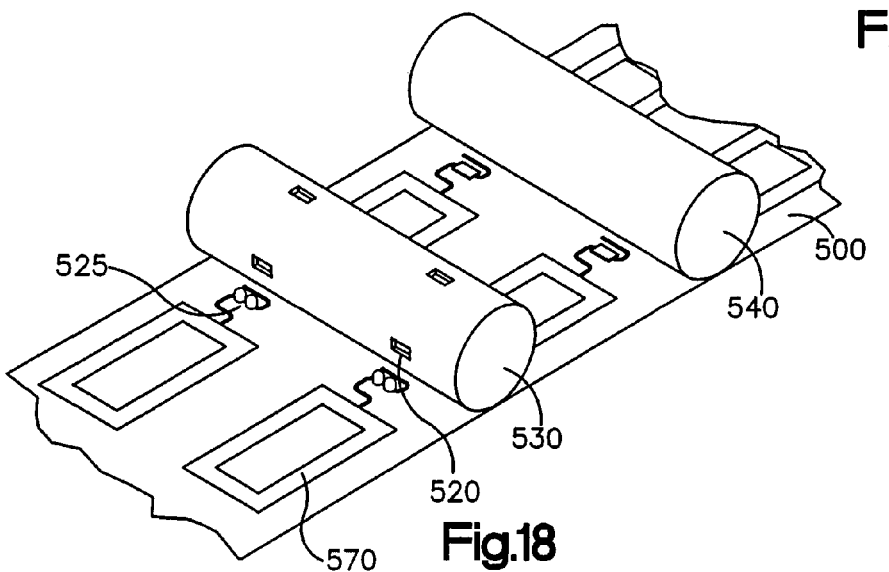
Fig.18

RFID DEVICE AND METHOD OF FORMING

This application is a division of U.S. application Ser. No. 10/871,169, filed Jun. 18, 2004 now U.S. Pat. No. 7,224,280, which is both a continuation-in-part of U.S. application Ser. No. 10/334,290, filed Dec. 31, 2002, now U.S. Pat. No. 6,940,408, as well as a continuation-in-part of PCT Application No. PCT/US03/41534, filed Dec. 31, 2003. All of the above applications are hereby incorporated by reference in their entireties.

BACKGROUND OF THE INVENTION

1. Field of the Invention

This invention relates to the field of radio frequency identification (RFID) tags and labels, and to particular configuration of such devices and methods of manufacturing such devices.

2. Description of the Related Art

RFID tags and labels have a combination of antennas and analog and/or digital electronics, which may include for example communications electronics, data memory, and control logic. RFID tags and labels are widely used to associate an object with an identification code. For example, RFID tags are used in conjunction with security-locks in cars, for access control to buildings, and for tracking inventory and parcels. Some examples of RFID tags and labels appear in U.S. Pat. Nos. 6,107,920, 6,206,292, and 6,262,692, all of which this application incorporates by reference.

RFID tags and labels include active tags, which include a power source, and passive tags and labels, which do not. In the case of passive tags, in order to retrieve the information from the chip, a "base station" or "reader" sends an excitation signal to the RFID tag or label. The excitation signal energizes the tag or label, and the RFID circuitry transmits the stored information back to the reader. The "reader" receives and decodes the information from the RFID tag. In general, RFID tags can retain and transmit enough information to uniquely identify individuals, packages, inventory and the like. RFID tags and labels also can be characterized as to those to which information is written only once (although the information may be read repeatedly), and those to which information may be written during use. For example, RFID tags may store environmental data (that may be detected by an associated sensor), logistical histories, state data, etc.

Methods for manufacturing RFID labels are disclosed in U.S. Pat. No. 6,451,154, assigned to Moore North America, Inc., which is incorporated herein by reference in its entirety. The method disclosed in U.S. Pat. No. 6,451,154 uses a number of different sources of RFID inlets, each inlet including an antenna and a chip. A plurality of webs are matched together and RFID labels are die cut from the webs, to produce RFID labels with liners. Alternatively, linerless RFID labels are produced from a composite web with a release material on one face and pressure-sensitive adhesive on the other, the labels formed by perforations in the web. Various alternatives are possible.

Still other RFID devices and methods for manufacturing RFID labels are disclosed in U.S. Patent Application Publication No. US2001/0053675 by Plettner, which is incorporated herein by reference in its entirety. The devices include a transponder comprising a chip having contact pads and at least two coupling elements, which are conductively connected with the contact pads. The coupling elements are touch-free relative to each other and formed in a self-supported as well as a free-standing way and are essentially extended parallel to the chip plane. The total mounting height of the transponder corresponds essentially to the mounting height of the chip. The size and geometry of the coupling elements are adapted for acting as a dipole antenna or in conjunction with an evaluation unit as a plate capacitor. Typically, the transponders are produced at the wafer level. The coupling elements can be contacted with the contact pads of the chip directly at the wafer level, i.e., before the chips are extracted from the grouping given by the wafer.

In many applications, it is desirable to reduce the size of the electronics as small as possible. In order to interconnect very small chips with antennas in RFID inlets, it is known to use a structure variously called "straps", "interposers", and "carriers" to facilitate inlay manufacture. Interposers include conductive leads or pads that are electrically coupled to the contact pads of the chips for coupling to the antennas. These pads provide a larger effective electrical contact area than ICs precisely aligned for direct placement without an interposer. The larger area reduces the accuracy required for placement of ICs during manufacture while still providing effective electrical connection. IC placement and mounting are serious limitations for high-speed manufacture. The prior art discloses a variety of RFID strap or interposer structures, typically using a flexible substrate that carries the interposer's contact pads or leads.

One type of prior art RFID inlet manufacture using interposers is disclosed in European Patent Application EP 1039543 A2 to Morgan Adhesives Company ("Morgan"). This patent application discloses a method of mounting an integrated circuit chip (IC) using an interposer connected across a gap between two thin conductive film sections of a conductive film antenna. The interposer comprises a thin substrate having two printed conductive ink pads. This method is said to be suitable for mass production of radio frequency identification tags (RFIDs) by mounting ICs on interposers that are then physically and electrically connected to the antenna sections using a pressure sensitive conductive adhesive. The pressure sensitive conductive adhesive provides a direct electrical connection between the interposer contact pads and the antenna sections.

Another type of prior art RFID inlet manufacture using interposers is based on a technique for manufacturing microelectronic elements as small electronic blocks, associated with Alien Technology Corporation ("Alien") of Morgan Hill Calif. Alien has developed techniques to manufacture small electronic blocks, which it calls "NanoBlocks", and then deposit the small electronic blocks into recesses on an underlying substrate. To receive the small electronic blocks, a planar substrate 200 (FIG. 1) is embossed with numerous receptor wells 210. The receptor wells 210 are typically formed in a pattern on the substrate. For instance, in FIG. 1 the receptor wells 210 form a simple matrix pattern that may extend over only a predefined portion of the substrate, or may extend across substantially the entire width and length of the substrate, as desired. Alien has a number of patents on its technique, including U.S. Pat. Nos. 5,783,856; 5,824,186; 5,904,545; 5,545,291; 6,274,508; and 6,281,038, all of which the present application incorporates by reference. Further information can be found in Alien's Patent Cooperation Treaty publications, including WO 00/49421; WO 00/49658; WO 00/55915; WO 00/55916; WO 00/46854 and WO 01/33621, all of which this application incorporates by reference in their entireties.

Alien's NanoBlock technology is adapted to interposer manufacture for producing RFID inlets in U.S. Pat. No. 6,606,247. A carrier substrate or interposer is coupled to an IC that is recessed below a surface of the interposer. The interposer further includes first and second carrier connection pads that interconnect with the IC using metal connectors. A planar antenna substrate carries first antenna sections with respective first and second receiving connection pads. The carrier substrate is coupled to the antenna substrate using the carrier connection pads and receiving connection pads. In contrast to the interposer of Morgan's European publication EP 1039543 A2 in which the IC is mounted above the interposer contact pads at the surface of the interposer substrate, in U.S. Pat. No. 6,606,247 the chips are retained in recesses in the interposer substrate, and the carrier connection pads are formed above the IC. However, both EP 1 039 543 A2 and U.S. Pat. No. 6,606,247 share the feature that the interposer or strap pads are directly electrically connected to the antenna sections using conductive adhesive.

As noted above, RFID inlets using interposers provide an inherent advantage in high speed manufacture by facilitating effective mechanical and electrical connection of ICs to antennas. However, other substantial manufacturing problems must be solved in order to provide an efficient inlay production process using interposers. U.S. Published Patent Application No. 2003/0136503 A1, commonly assigned herewith, discloses processes for producing RFID interposers and attaching the interposers to an antenna web. The interposers are severed or separated from a webstock or sheetstock with densely packed IC's (i.e. small pitch between adjacent ICs) and interposer leads. The interposers are then transported, "indexed" (spread apart), and affixed in sequence to a webstock containing antennas that are typically spaced at a much higher pitch.

Another problem to be solved in producing inlays using interposers is the reliable high speed mechanical and electrical coupling of the interposers (and interposer leads) to antennas. The present invention, in contrast to Morgan's EP 1 039 543 A2 and Alien's U.S. Pat. No. 6,606,247, uses a non-conductive adhesive to mechanically couple the interposer leads to the antenna sections. Non-conductive adhesives can facilitate high speed production in comparison to conductive adhesives, due to reduction of cure time requirements and production cycle times. However, since the adhesive is not electrically conductive, another mechanism (besides electrical conduction by the adhesive) must be provided to electrically couple the interposer leads to the antenna sections.

From the foregoing it will be seen that room exists for improvements in RFID tags and methods of assembling such tags.

SUMMARY OF THE INVENTION

According to an aspect of the invention, an RFID inlay includes an inlay substrate; an antenna on the inlay substrate; an interposer, which in turn includes an RFID chip having contacts thereupon, and interposer leads operatively coupled to the contacts of the chip; a non-conductive adhesive attaching the interposer to the inlay substrate; and a conductive connection operatively coupling the interposer leads and the antenna.

According to an aspect of the invention, an RFID inlay includes conductive bumps that electrically couple interposer leads to an antenna, and a non-conductive adhesive attaching the interposer to the inlay substrate.

According to yet another aspect of the invention, a method of making an RFID inlay includes placing an interposer on an inlay substrate such that conductive bumps on the interposer are in contact with an antenna on the substrate, and attaching the interposer to the antenna and inlay substrate. According to a specific embodiment of the invention, the attaching may include curing an adhesive on the conductive bumps.

According to another aspect of the invention, an RFID inlay includes an inlay substrate; an antenna on the inlay substrate; an interposer attached to the antenna and the inlay substrate, wherein the interposer includes: an RFID chip having contacts thereupon, and interposer leads operatively coupled to the contacts of the chip; and a non-conductive adhesive attaching the interposer to the inlay substrate; and a conductive connection operatively coupling the interposer leads and the antenna According to a still further aspect of the invention, a radio frequency identification (RFID) device includes a substrate; an antenna on the substrate; and an interposer, wherein the interposer includes: an RFID chip having contacts thereupon; and interposer leads operatively coupled to the contacts of the chip; wherein the interposer leads and the antenna are capacitively coupled together via non-conductive pads.

According to another aspect of the invention, a radio frequency identification (RFID) device includes a capacitive coupling between conductive leads of an interposer or strap, and an antenna, via non-conductive adhesive pads.

According to still another aspect of the invention, a radio frequency identification (RFID) device includes pressure-sensitive adhesive pads between an antenna and conductive leads of strap or interposer. A chip, which is electrically coupled to the conductive leads, is capacitively coupled to the antenna across the adhesive pads.

According to another aspect of the invention, a radio frequency identification (RFID) inlay includes a substrate; an antenna on the substrate; an interposer, wherein the interposer includes: an RFID chip having contacts thereupon; and interposer leads operatively coupled to the contacts of the chip; and a non-conductive adhesive mechanically coupling the interposer and the substrate; wherein the interposer leads and the antenna are electrically coupled together.

According to a further aspect of the invention, a radio frequency identification (RFID) inlay includes a self-compensating capacitive coupling that electrically couples together an antenna and conductive leads of an interposer or chip. According to various embodiments of the invention, the capacitive coupling includes one or more of the following: pressure-sensitive adhesive pads; non-conductive polymer pads; dielectric pads that have a dielectric constant that is a non-constant function of thickness; dielectric pads having spacers therein; dielectric pads that include a high dielectric constant material; and an effective area of the coupling that is a non-constant function of thickness of dielectric pads.

According to a still further aspect of the invention, a radio frequency identification (RFID) device includes: an antenna; and an interposer. The interposer includes: an RFID chip having contacts thereupon; and interposer leads operatively coupled to the contacts of the chip. The interposer leads and the antenna are capacitively coupled together.

According to another aspect of the invention, a method of making a radio frequency identification (RFID) device includes the steps of: placing an antenna on a substrate; and capacitively coupling a chip to the antenna.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 5 is a side sectional view, along section 5-5 of FIG. 4;

FIG. 6 is an exploded view of the RFID inlay of FIG. 5;

FIG. 7 is a side sectional view of an alternate embodiment RFID inlay;

FIG. 8 is a side sectional view of another alternate embodiment RFID inlay;

FIGS. 9 and 10 are plan views showing an RFID interposer attached to alternative antenna configurations;

FIG. 11 is a side sectional view of yet another alternate embodiment RFID inlay;

FIG. 12 is a top view of another alternate embodiment RFID inlay;

FIG. 13 is an end view of one particular embodiment of the RFID inlay of FIG.

FIG. 14 is an end view of another particular embodiment of the RFID inlay of FIG. 10;

FIG. 15 is a side sectional view of an RFID label that includes an RFID inlay in accordance with the present invention;

FIG. 16 is a side sectional view of an RFID tag that includes an RFID inlay in accordance with the present invention;

FIGS. 17 and 18 are isometric views illustrating various steps of a method of fabricating an RFID inlay in accordance with the present invention;

FIG. 19 is a high level flow chart illustrating various steps of a method of fabricating an RFID inlay in accordance with the present invention;

DETAILED DESCRIPTION OF THE INVENTION

RFID Inlays—General Considerations

By way of overview, the present invention involves structures and method for operatively coupling parts of an RFID inlay together. Specifically, the invention relates to conductive or capacitive connections between an RFID antenna and an interposer that is in turn contains a chip, such as an integrated circuit chip. The conductive connection may include conductive bumps attached to the interposer, and/or may include conductive traces, such as a conductive ink traces. The capacitive connection may involve putting the antenna and the interposer into close proximity, to allow capacitive coupling between the antenna and the interposer. The capacitive and conductive connections provide a convenient, fast, and effective way to operatively couple antennas and interposers.

Figure 3:
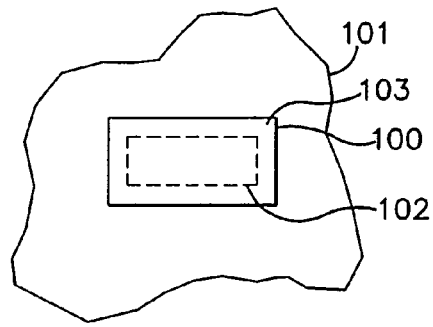
FIG. 3 illustrates an RFID tag or label adhered to an object.

Referring initially to FIG. 3, an RFID tag or label 100 is adhered or otherwise coupled to an object 101. The RFID tag or label 100 includes an RFID inlay 102 and a printable facestock 103. The RFID inlay 102 as used herein may include a variety of active and passive RFID devices.

Figure 4:
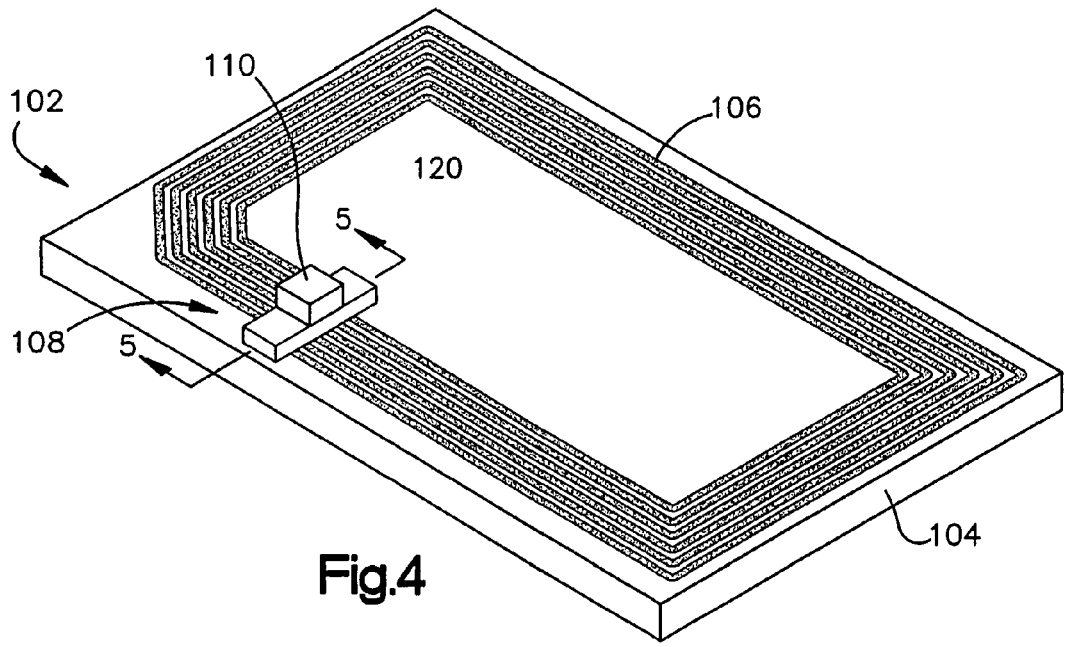
FIG. 4 is an isometric projection of an RFID inlay in accordance with the present invention.

Referring now and in addition to FIGS. 4-6, further details of the RFID inlay 102 are shown. The RFID inlay 102 includes an inlay substrate 104, with an antenna 106 thereupon. The inlay substrate 104 may be any of a variety of suitable materials. The suitable materials for the inlay substrate 104 may include materials that are flexible, and are suitable for use in roll-to-roll processes. The inlay substrate 104 may be a piece of material that has been separated from a webstock or sheetstock.

Examples of suitable materials for the inlay substrate 104 include, but are not limited to, high Tg polycarbonate, polyethylene terephthalate (PET), polyarylate, polysulfone, a norbornene copolymer, poly phenylsulfone, polyetherimide, polyethylenenaphthalate (PEN), polyethersulfone (PES), polycarbonate (PC), a phenolic resin, polyester, polyimide, polyetherester, polyetheramide, cellulose acetate, aliphatic polyurethanes, polyacrylonitrile, polytrifluoroethylenes, polyvinylidene fluorides, HDPEs, poly(methyl methacrylates), a cyclic or acyclic polyolefin, or paper.

The antenna 106 may be an antenna in any of a variety of suitable configurations. The antenna 106 may be made of a conductive material, such as a metallic material. (The terms "conductive" and "non-conductive," as used herein, refer to electrical conductivity.) The antenna 106 may be formed on the inlay substrate 104 by any of a variety of methods. For example, the antenna 106 may be formed from conductive ink that is printed or otherwise deposited on the inlay substrate 104. Alternatively, the antenna 106 may be formed from metal deposited on the inlay substrate 104 by any of a variety of suitable, known deposition methods, such as vapor deposition. As a further alternative, the antenna 106 may be part of a web of antenna material that is adhered to the substrate 104 by suitable means, for example, by use of a suitable adhesive in a lamination process. The web of a plurality of antennas may be made from, for example, copper, silver, aluminum or other thin conductive material (such as etched or hot-stamped metal foil, conductive ink, sputtered metal, etc.). The web of antennas may be on a film, coated paper, laminations of film and paper, or other suitable substrate. As yet another alternative, the antenna 104 may be formed by selective removal of metal from a metal layer, for example, using known lithography processes. It will be appreciated that other suitable means, for example, electroplating, may be used to form the antenna 106 on the inlay substrate 104.

The antenna 106 is described herein as being "on" the inlay substrate 104. It is intended that this description include configurations where the antenna 106 may be wholly or partly within the inlay substrate 104.

The RFID inlay 102 also includes an interposer 108 operatively coupled to the antenna 106. The elements of an "interposer," as the term is used herein, may include an integrated circuit (IC) chip, electrical connectors to the chip, and interposer leads coupled to the electrical connectors. An interposer also may include an interposer substrate, which may support other elements of the interposer, and may provide other characteristics such as electrical insulation. An interposer is elongate, as the interposer leads extend from the IC chip. The interposer may be flexible, rigid or semi-rigid. Thus the interposer 108 includes a chip 110 having chip contacts 114 that are operatively coupled to interposer leads 116. The chip 110 may be referred to herein in addition as an "electronic element." The chip 110 may be any of a variety of suitable electronic components for suitably interacting with the antenna 106, for example to receive and/or to send signals.

The interposer leads 116 may be completely made out of an electrically conducting material, such as being made out of a metal foil or printed conductor. Alternatively, the interposer leads 116 may include an electrically insulating material, for example being plastic coated with metal. The interposer 108 may include an interposer substrate 118, which the interposer leads 116 are attached to or deposited upon. The interposer substrate 118 may prevent electrical contact between the interposer leads 116 and the antenna 104, and/or may be used to mechanically support the interposer leads 116. The interposer substrate 118 may be made of any of a variety of suitable materials, for example, suitable flexible polymeric materials, such as PET, polypropylene or other polyolefins, polycarbonate, or polysulfone.

It will be appreciated that a variety of interposer configurations are available for coupling to the antenna 106. Examples include an RFID interposer available from Alien Technologies, and the interposer marketed under the name I-CONNECT, available from Philips Electronics.

Conductive Coupling of Inlays

In certain inlay embodiments, the interposer leads 116 are operatively coupled to the antenna 106 via an electrically-conductive connection 120. As shown in FIGS. 5 and 6, the conductive connection 120 may include electrically conductive bumps 124 on the interposer leads 116. Alternatively, or in addition, the conductive connection 120 may include conductive traces, such as conductive ink traces, coupling the interposer leads and the antenna 106. Such conductive traces are described below with regard to other embodiments.

The conductive bumps 124 facilitate operative connection of the interposer 112 to the antenna 106 and/or the inlay substrate 104. The conductive bumps 124 are used in electrically coupling the interposer leads 116 to the antenna 106.

The conductive bumps 124 may be any of a variety of electrically conductive materials, such as suitable metals. Examples of metals used in making conductive bumps are gold, nickel, and palladium. In addition, the conductive bumps 124 may include a multitude of small, hard particles, providing a multitude of sharp points for penetrating the mating contact surface (the antenna 106). An example of suitable small, hard particles are diamond particles, such as in diamond dust.

In an exemplary process, the conductive bumps 124 may be formed by depositing the hard particles onto surfaces of the interposer leads 116. For example, a nickel electroplating process may be used to deposit the hard particles. In the electroplating process the hard particles and the contact surface are encapsulated in the nickel. If necessary, a photoresist may be used as a mask, using standard lithographic means, for masking portions of the interposer 112 during the electroplating to form the conductive bumps 124. The nickel may then be overplated with another material, such as gold, for example, to provide a corrosion-resistant surface. The presence of the hard particles makes for conductive bumps 124 that have a large number of sharp points 130 extending out of the surface of the conductive bumps 124. When brought into contact with the antenna 106 the sharp points penetrate into the material of the antenna, and/or penetrate an oxide film, such as an aluminum or copper oxide film, coating the surface of the antenna 106. Thus an electrical connection between the interposer leads 116 and the antenna 106 is accomplished.

The sharp points 130 may even be capable of extending through a bump-antenna adhesive 134 between the conductive bumps 124 and then antenna 106. The bump-antenna adhesive 134 may be a non-conductive adhesive, an isotropic electrically-conductive adhesive or an anisotropic electrically-conductive adhesive. The bump-antenna adhesive 134 may be a UV-cured adhesive or a heat-curable adhesive. The conductive bumps 124 may each have a height from about 5 to 25 microns (about 0.0002 to 0.001 inches). The interposer substrate 118 may have a thickness of from about 0.0005 inches to about 0.007 inches.

Formation of conductive bumps 124 such as those described above may be accomplished, for example, by use of WAFERPIERCE technology marketed by NanoPierce Technologies, Inc., of Denver, Colo. Such technology is described in greater detail in PCT Publication WO 02/25825, which is incorporated herein by reference in its entirety.

As noted earlier, it will be appreciated that the interposer leads 116 may include a dielectric material with conductive layers on one or both sides. For such interposer leads, conductive-material-filled holes in the dielectric material may be utilized in order to operatively couple the chip contacts 114 and the conductive bumps 124.

As shown in FIG. 6, the interposer 112 may be attached to the antenna 106 and/or the inlay substrate 104 via the bump-antenna adhesive 134 and/or via an interposer-substrate adhesive 136. As noted above, the bump-antenna adhesive 134 may be a conductive adhesive or may be a non-conductive adhesive, such as pressure-sensitive adhesives or epoxy adhesives. The interposer-substrate adhesive 136 may be a non-conductive adhesive, to prevent undesired electrical connection between various parts of the antenna 106.

Further, as noted above and as shown in FIG. 7, the interposer substrate 118 may be omitted. In such a configuration a non-conductive interposer-substrate adhesive 134 may also prevent undesired contact between the antenna 106 and un-bumped parts of the interposer leads 116.

As another alternative, as shown in FIG. 8, both of the adhesives 134 and 136 may be omitted, with the conductive bumps 124 non-adhesively secured to the antenna 106. For example, the conductive bumps 124 may be welded to the antenna 106, such as by laser welding or ultrasonic welding.

It will be appreciated that the antenna 106 illustrated in the figures is only one example of the wide variety of antenna configurations that the chip 110 and the interposer 112 may be coupled to. Connection of the chip 110 and the interposer 112 to alternative antenna configurations 106' and 106" is illustrated in the FIGS. 9 and 10, respectively.

By using the interposer leads 116, instead of directly connecting the chip contacts 114 to the antenna 106, tolerances for placement may be larger, due to the interposers 116 having a larger surface for connection, and thus, more of a tolerance for errors in placement than the chip contacts 114. Further, the conductive bumps 124 provide advantages when compared to prior methods of joining the interposer leads 116 directly to the antenna 106. Using the conductive bumps 124 may allow a reduction in the time required for curing the adhesive coupling the interposer to the antenna. This is because using the conductive bumps allows use of a non-conductive adhesive as the bump-antenna adhesive 134, and non-conductive adhesives may have shorter curing times when compared with conductive adhesives. In addition, compared with conductive adhesives, non-conductive adhesives may be easier to work with, may have longer shelf life, and may be less expensive. By use of the conductive bumps 124, the time for curing the adhesive 134 may be reduced to under 2 seconds, which may be compared with the over 20 seconds required to couple interposer leads to an antenna using the prior art processes. In addition, curing of the bump-antenna adhesive 134 may be accomplished without applying pressure, for example, by using ultraviolet curing.

Further, the sharp points 130 on the conductive bumps 124 allow a better connection to be made with the antenna 106, albeit with less force, when compared to the smooth undersides of the interposer leads 116. The sharp points 130 serve to concentrate any downward force of the interposer 112 against the antenna 106 and/or the inlay substrate 104, thus facilitating a good electrical connection between the conductive bumps 124 and the antenna 106.

FIG. 11 shows an alternate configuration, wherein the interposer 112 and its chip 110 are located within a depression 150 in the inlay substrate 104. The interposer 112 may be placed in the depression 150 using fluidic self-assembly or other suitable processes. After placement of the interposer 112 in the depression 150, the antenna 106 is then formed or placed on the inlay substrate 104 in contact with the conductive bumps 124.

FIGS. 12-14 show other embodiments of the RFID inlay 102. The embodiments shown in FIGS. 12-14 all include conductive traces 160 that electrically couple the interposer leads 116 to the antenna 106, either as an alternative to or in addition to connection via bumps on the interposer leads 116. FIG. 12 shows a generalized configuration of an RFID inlay 102 having conductive traces 160, while FIGS. 13 and 14 show specific embodiments of such an inlay. FIG. 13 shows the conductive trace 160 making a connection between the antenna 106 and the interposer lead 116 in addition to connection via the conductive bump 124. FIG. 14 shows the conductive trace 160 as being an alternative means of coupling the interposer leads 116 and the antenna 106. In the configuration in FIG. 14 a non-conductive adhesive 162, for example, a pressure-sensitive adhesive (PSA), is utilized between the interposer leads 116 and the antenna 106. It will be appreciated that the non-conductive adhesive 162 is representative of a larger category of couplings between the interposer 116 and the antenna 106. For example, attachment between the interposer 116 and the antenna 106 may be accomplished by thermal plastic welding, or by ultrasonic welding.

The conductive traces 160 may be formed by printing a conductive ink such as a silver ink, dispensed as a conductive epoxy, in areas where desired. Alternatively, the conductive traces may include a conductive adhesive.

As may be seen in FIGS. 13 and 14, the conductive traces 160 may be in contact with both a top surface 164 and a side surface 166 of the interposer lead 116. Alternatively, the conductive traces 160 may be in contact with only one of the surfaces 164 and 166.

A fabrication process of making RFID inlays with conductive traces may include the steps for forming an antenna on an inlay substrate material, and attaching an interposer to the inlay substrate and antenna. Thereafter the conductive traces may be deposited on the RFID inlay to couple the interposer leads and the antenna. As noted above, the conductive traces may be formed by printing of conductive ink. The printing may include any of a variety of suitable printing techniques, such as screen printing, ink jet printing, or gravure printing. It will be appreciated that other suitable methods may be used to form the conductive traces. For example, vapor deposition methods or methods such as sputtering may be utilized.

RFID Tags and Labels

Figure 1:
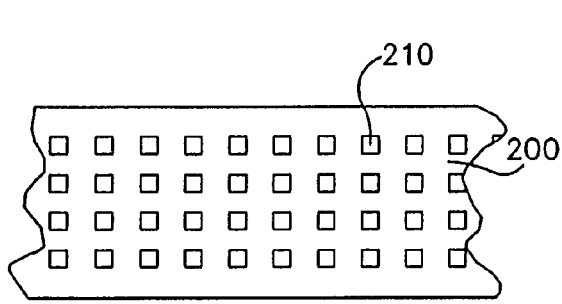
FIG. 1 illustrates a pattern of embossed wells on the surface of a portion of a web, into which small electronic blocks of complementary shape may be embedded.
Figure 2:
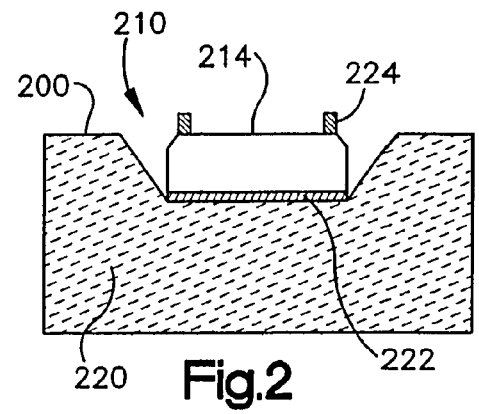
FIG. 2 illustrates a small electronic block embedded in a well in a section cut out from an embossed substrate.

In both the conductively coupled inlays described above and the capacitively coupled inlays described further below, the RFID tag and label 100 may include other layers besides the inlay 102. RFID tags and labels 100 may include a web or sheet of selected used to support and protect the RFID inlay stock, and/or to provide usable form factors and surface properties (e.g. printability, adhesive anchorage, weatherability, cushioning, etc.) for specific applications. For example, a suitable top web or facestock layer for carrying printing, such as the facestock 103 shown in FIG. 1, may be utilized. Suitable materials for the facestock include, but are not limited to, metal foils, polymer films, paper, textiles, and combinations thereof. Textiles include woven and non-woven fabrics made of natural or synthetic fibers. The materials can be single-layered paper or film or they can be multi-layered constructions. The multi-layered constructions or multi-layered polymeric films can have two or more layers, which can be joined by coextrusion, lamination, or other processes. The layers of such multi-layered constructions or multi-layered polymeric films can have the same composition and/or size or can have different compositions or sizes.

As shown in FIG. 15, the inlay 102 may be part of an RFID label 100' that is adhesively adhered to the object. Besides the facestock 103, the RFID label 100' has an adhesive layer 170 for adhering it to the object 101. In addition, the label 100' may have a protective layer 172 between the inlay 102 and the adhesive layer 170. The RFID label 100' may also have other layers, such as adhesive layers coupling the facestock 103 to the inlay 102 and/or to the protective layer 172.

A wide variety of suitable adhesives may be used for the various parts of the RFID label 100'. For example, a suitable general-purpose, permanent pressure-sensitive adhesive or a laminating adhesive may be utilized. A wide variety of permanent pressure-sensitive adhesives are well known in the art. The pressure-sensitive adhesive may be one of any number of different types of adhesives, such as acrylic and elastomeric pressure-sensitive adhesives. If the facestock 103 is to be printed in a printer that generates high heat, such as a laser printer, the adhesives may be made to be temperature stable, such as is disclosed in Avery Dennison's U.S. Pat. No. 4,898,323, incorporated herein by this reference.

As a further alternative, a water activated adhesive, a heat activated adhesive, other types of adhesives known in the art may be used in adhering the RFID label 100' to the object. A bottom adhesive layer may be a printable material, such as paper or a coated polymer, for use in situations where a user wishes to print both the front and the back of the label in a printer. The adhesive surface of the label may include adhesive covering the entire bottom of the label, or may be coated in a pattern, as is known in the art. The adhesive may be of the sort that is removable so that the label may be removed from the substrate after it is applied thereto, or the adhesive may be a permanent type of adhesive for permanently bonding the label to the substrate. Alternatively, the adhesive may be repositionable, so that the label may be repositioned on the substrate after it is initially applied.

It will be appreciated that non-adhesive means may alternatively be used to secure an RFID tag 100" to an object 101, as is illustrated in FIG. 16. In the case of a dual sided tag used, for example, on clothing, a hole may be punched in one end of the tag 100", and a plastic fastener, string or other fastening means is inserted through the hole. The RFID tag 100" may have facestocks 103 and 103' on both sides of the RFID inlay 102, for instance to allow both sides of the RFID tag 100" to be printed.

Layers of the label or tag may be bonded together by means other than adhesive. For example, the integrated circuit may be held in place with a hot melt resin or other substance, which could also serve as a bonding agent. The resin could then take the place of an adhesive layer. Layers may also be bonded together by, for example, ultrasonic welding.

Alternatively, the label may have no adhesive on the underside whatsoever, as to when the label (or tag) is to be attached to the substrate by other means, which could include sewing, welding, heat bonding, or any other affixing method known in the tag or label art.

Articles according to the present invention may be, for example, a luggage label or tag, a laundry label or tag, a label or tag for cataloging library articles, a label or tag for identifying an apparel product, a label or tag for identifying a postal article, a label or tag for identifying a medical article, or a label or tag for a transportation ticket.

An RFID label or tag may have more than one RFID chip. The RFID chips may be arranged in a row, column or matrix, and may be electrically interconnected with one another.

As another alternative, a label or tag may include electrical and/or electronic components other than RFID chips. For instance, an RFID label or tag may include a sensor, a MEMS, or other type of component. The components may be electrically interconnected to form a circuit. The type of electrical and/or electronic components to be used can be selected by one of ordinary skill in the art and depends on the use of the label or tag. Additional details of roll-to-roll fabrication processes for integrating interposers into RFID inlays in roll form are disclosed in Avery Dennison's United States Patent Application Publication No. 2003/0136503, titled "RFID Label Technique," which is incorporated herein by reference in its entirety.

Methods of Fabrication

The following description of methods of fabricating inlays applies both to the conductively coupled inlays, described above, and the capacitively coupled inlays, described further below. As stated above, the RFID inlay 102 may be assembled using a roll-to-roll process. That is, the inputs to the process may include large rolls of materials of the various layers and structures of at least some of the RFID inlay 102. Following are exampled of some methods that may be used in fabrication of the RFID tags or labels described above.

FIG. 17 illustrates a web 500 of RFID inlay substrate material onto which antennas 510 are printed or otherwise formed. Once antennas are on the web, individual interposers 520 are affixed to the antennas, as FIG. 18 illustrates. In one approach, the interposers 520 are held against an anvil 530 by a vacuum. The interposers 520 are deposited onto appropriate contact portions 525 for the antennas 510.

As described above, the leads of the interposers 520 may be affixed to the antennas 510 by means of an adhesive such as a non-conductive adhesive. The adhesive may be cured with UV radiation, heat, and/or pressure, as appropriate, as indicated at 540.

FIG. 19 is a high-level block diagram illustrating steps in a method 600 of manufacturing RFID inlays using such rolls. At step 604, a roll of the RFID inlay substrate material is unwound for printing. At step 610 antennas are printed or otherwise formed on the RFID inlay substrate material at a pitch corresponding to the desired pitch of the labels. Then, at step 612 the interposers bearing the RFID chips are placed on in contact with the antennas. Finally, individual inlays are cut or separated from the web at step 616. The cutting may be accomplished by die cutting or by other cutting methods in the art, such as laser cutting, perforating, slitting, punching, or other known means that can scribe to specific shapes and sizes.

As an alternative to the foregoing methods of placing the interposers bearing RFID chips, the interposers may be placed using a pick-and-place operation. The interposers may be formed on a web or sheet of interposer substrate material, and separated from the web or sheet, such as by cutting. The interposers may then be integrated into an RFID inlay stock using a pick-and-place operation.

The pick and place operation may be performed by a pick and place device, which may include mechanical and/or vacuum grips to grip an interposer bearing a small electronic block while moving it into the desired location in alignment with the label. It will be appreciated that a wide variety of suitable pick and place devices are well known. Examples of such devices are the devices disclosed in U.S. Pat. Nos. 6,145,901, and 5,564,888, both of which are incorporated herein by reference, as well as the prior art devices that are discussed in those patents.

Alternatively, rotary placers may be utilized to place the interposers upon the labels. An example of such a device is disclosed in U.S. Pat. No. 5,153,983, the disclosure of which is incorporated herein by reference.

The integrated circuits or RFID chips may be friction fitted in recesses in the RFID microelectronic stock, or they may be secured therein by the use of adhesives and/or solder. Electrical connection between the RFID chips and circuitry to be connected to the antennas may be done with wire bonding, ribbon bonding, tape-automated bonding, lead frames, flip chip bonding, and/or conductive gluing of leads.

As an alternative to fitting or bonding the RFID chip into a well as part of the interposer substrate, the chip could be affixed atop the interposer substrate or could be otherwise incorporated into or onto the substrate. For example, the RFID IC could be a "flip chip" type, wherein the die is made so that exposed contacts, or pads on the die have bumps on them. In normal flip chip packaging, the die is flipped over and contacted directly into the leads that provide electrical contacts for a circuit including the IC. RFID tag and label constructions using "flip chip" technology are available for example from KSW Microtec GmbH, Dresden Germany.

As another example of IC packaging technologies compatible with the present invention, the manufacturing method of the invention may be used with "lead frame" webs. In this embodiment, the IC would be mounted to a web with a conductive metal network which may have relatively large area portions, commonly called pads or flags, for direct contact with semiconductor chips, and lead elements for facilitating electrical interconnection of the chips or dies via intermediate (e.g., jumper) connections to the antenna.

In an embodiment of the invention, interposers are mass-produced on an interposer substrate in the form of a flexible web stock or sheet stock. Herein, "RFID webstock" and "RFID sheetstock", refer to a flexible webstock or sheetstock such as a polymeric film, with embedded or attached chips and associated connectors and interposer leads. A series of interposers comprising RFID chips and circuitry to be attached to antennas are formed on the interposer substrate, e.g. in an array, then individual interposers are separated or cut from the substrate such as by die-cutting. The manufacturing process of Avery Dennison's United States Patent Application Publication No. 2003/0136503 involves "indexing" of interposers: After cutting the RFID web stock into lanes of interposers and/or individual interposers, the spacing of the interposers is increased in the down-web direction, the cross-web direction, or both before attaching the interposers to antennas arrayed on an antenna web.

In one embodiment of the invention, shown in FIG. 11 and described above, the initial step in manufacturing an RFID inlay involves forming receptor wells or holes in a polymeric film substrate, herein sometimes called a "receptor film". In such an embodiment, the polymeric film substrate is a material selected from a class of polymeric films described in commonly-assigned U.S. Patent Application Publication No. 2003/0232174, titled "Method of Making a Flexible Substrate Containing Self-assembling Microstructures." The receptor holes are formed in this substrate film using the precision continuous embossing process disclosed in the '281 patent application. These polymeric materials, and the preferred process for forming receptor wells, are described below. Alternatively, the polymeric film substrate may be selected from the polymeric materials described in Alien Technology Corporation's patent applications, such as PCT International Publication WO 00/55916. Alternative techniques for forming microstructure receptor wells or holes in the polymer film substrate, as described in Alien's patent publications, include for example stamping and injection molding.

The polymer film includes wells that are filled with tiny electronic component chips via a Fluidic Self-Assembly (FSA) process, such as that developed by Alien Technology Corporation of Morgan Hill, Calif. Then, a planarizing layer is coated on top of the filled wells. The purpose of the planarization is to fill any gaps that still may be present; to provide a smooth, flat surface for later processes, such as the etching of vias; to assure that the microelectronic block elements (i.e. chips) are maintained in position in their recesses on the substrate during further processing steps; and to provide mechanical integrity for the laminate. "Vias" are then created with etching techniques. The vias are then coated with aluminum to form a pair of pads on opposite sides of the chip for electronic connection. As noted above the polymeric film web at this stage of the process is referred to herein as an RFID webstock.

Capacitive Coupling of Inlays

As an alternative to direct electrical coupling between interposer leads and antenna, capacitive or reactive coupling may be used to couple together overlapped regions of interposer leads and an antenna. Put another way, signals such as radio waves may be coupled between overlapping regions of the interposer leads and antenna elements by a non-direct coupling mechanism that is inherently created as a part of the assembly process. The non-direct coupling may be termed "reactive coupling" in that it involves reaction and interaction between electric fields generated by the interposer leads and the antenna.

References herein to capacitive or reactive coupling refer to coupling that is predominantly or primarily capacitive or reactive. It will be appreciated that coupling that is primarily capacitive may also include some inductive coupling as a secondary coupling mechanism. Conversely, coupling that is primarily inductive may also include some capacitive coupling. Capacitive coupling, as the term is used herein, may also include some direct conductive coupling, albeit not as the primary type of electrical coupling.

Figure 20:
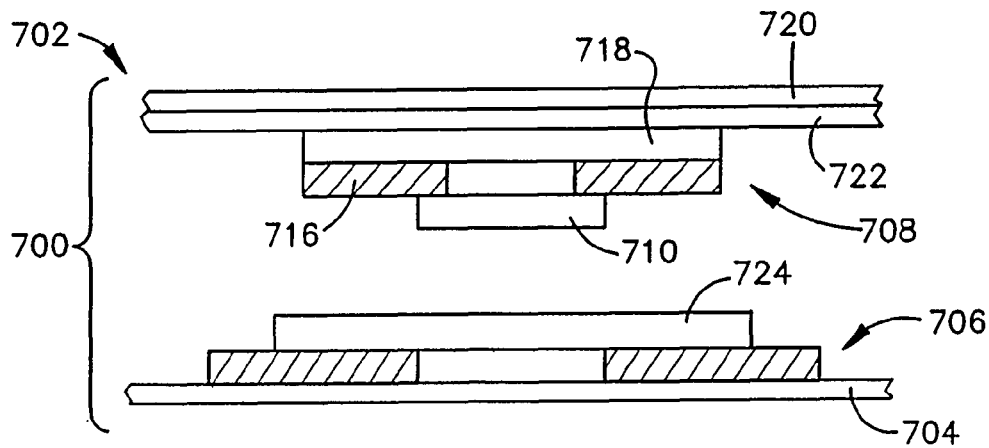
FIG. 20 is a cross-section side view of part of a first embodiment capacitive-coupling RFID inlay of the present invention.

FIG. 20 shows one embodiment of an RFID device 700 that includes an RFID inlay 702. The RFID device includes a substrate 704, with an antenna 706 thereupon. The substrate 704 and the antenna 706 may be similar to the inlay substrate 104 and the antenna 106 (FIG. 1) described above. An interposer 708, which may be similar to the interposer 108 (FIG. 1) described above, includes a chip 710 that is electrically coupled to interposer leads 716. The interposer 708 includes an interposer substrate 718 that is attached to the interposer leads 716. The interposer 708 is capacitively coupled to the antenna 706.

The RFID device 700 also has several other layers: a label facestock 720, an adhesive layer 722, and a dielectric layer 724 between the antenna 706 and the interposer 708. The label facestock 720 provides a printable surface for the RFID device 700, and may serve to protect internal parts of the RFID device 700 from damage or contaminants. It will be appreciated that the label facestock 720 may be a printable or non-printable material, and may include any of a variety of well-known suitable materials. The adhesive layer 722 is used to connect the interposer 708 to the label facestock 720. For example, the interposer substrate 718 may be attached to the facestock layer 720 by use of the adhesive layer 722. In addition, the adhesive layer 722 may be used to adhere the label facestock 720 to the substrate 704, to hold together the parts of the RFID device 700, and to seal the internal parts of the RFID device 700 within the label facestock 720 and the substrate 704. The adhesive layer 722 may be a suitable pressure-sensitive adhesive.

The dielectric layer 724 may prevent direct conductive contact between the interposer leads 716 and the antenna 706. Instead, the interposer leads 716 and the antenna 706 are capacitively coupled together, through the intervening dielectric layer 724. The dielectric layer 724 may be configured so as to provide suitable, repeatable capacitive coupling between the interposer leads 716 and the antenna 706. The dielectric layer 724 may be printed or otherwise placed on a portion of the antenna 706 that is to receive and be coupled to the interposer 708.

A suitable material for the dielectric layer 724 is a UV-curable dielectric material, ELECTRODAG 1015, available from Acheson. However, it will be appreciated that a wide variety of other suitable materials may be used instead. The dielectric layer 724 may have a thickness from about 5 microns to about 25 microns.

The interposer 708 may be placed at a suitable location on the adhesive layer 722 by a pick-and-place operation, for example. The label facestock 720 and the substrate 704 may be pressed together by a suitable lamination operation to adhere them together with the adhesive layer 722.

It will be appreciated that many variations are possible. For example, it may be possible to omit the dielectric layer 724. The incidental contact between the interposer leads 716 and the antenna 706 may be insufficient to allow conductive coupling between them, so that the resulting device (even without the dielectric layer 724) may still be a capacitively-coupled device.

Figure 21:
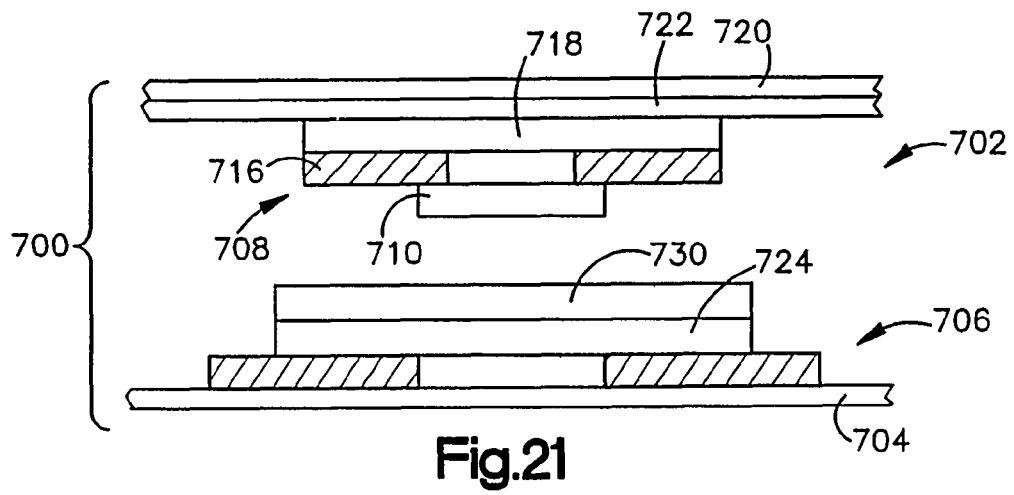
FIG. 21 is a cross-section side view of part of a second embodiment capacitive-coupling RFID inlay of the present invention.

FIG. 21 shows another variation on the configuration shown in FIG. 20, with an additional adhesive layer 730 between the interposer 708 and the dielectric layer 724. The additional adhesive layer 730 may aid in adhering the interposer 708 and the dielectric layer 724.

Figure 22:
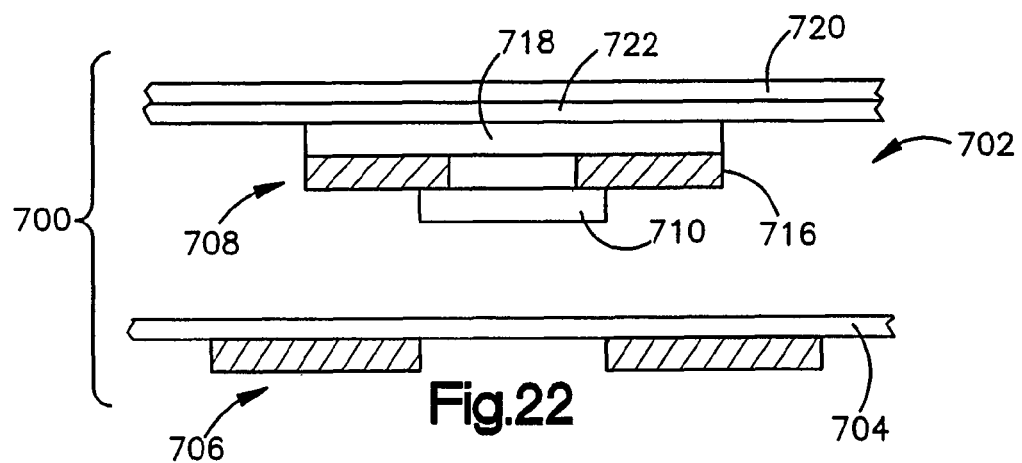
FIG. 22 is a cross-section side view of part of a third embodiment capacitive-coupling RFID inlay of the present invention.

FIG. 22 shows another embodiment of the RFID device 700, with the antenna 706 on a back side of the substrate 704, so that part of the substrate 704 is the dielectric material between the antenna 706 and interposer 708. The interposer leads 716 and the antenna 706 are thus capacitively coupled across the substrate 704. Additional layers may be used to cover the antenna 706 and/or to adhere the RFID device 700 to objects. In addition, an adhesive layer may be added between the interposer 708 and the substrate 704, similar to the additional adhesive layer 730 (FIG. 21).

Figure 23:
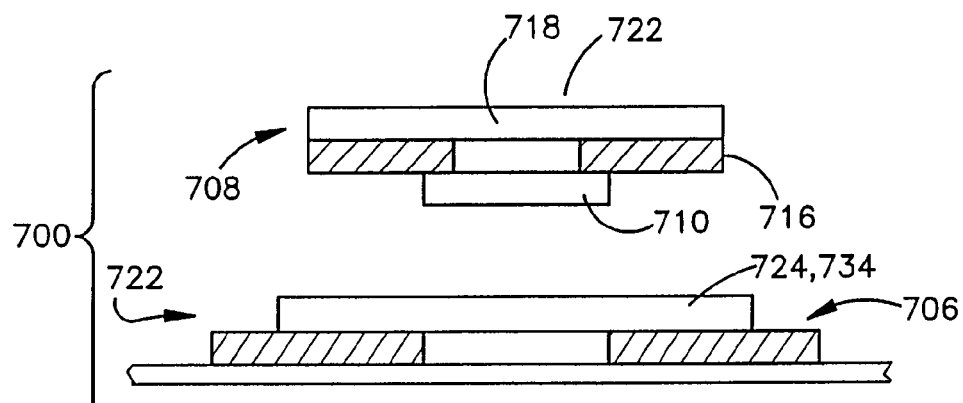
FIG. 23 is a cross-section side view of part of a fourth embodiment capacitive-coupling RFID inlay of the present invention.

Turning now to FIG. 23, the dielectric layer 724 itself may be a non-conductive adhesive layer 734, including for example a pressure-sensitive adhesive. Suitable non-conductive adhesives are described above with regard to other embodiments. The interposer 708 may be adhered to the adhesive layer 734 either in a face-up configuration (with the interposer leads 716 away from the antenna 706) or a face-down configuration (with the interposer leads 716 closer from the antenna 706).

Figure 24:
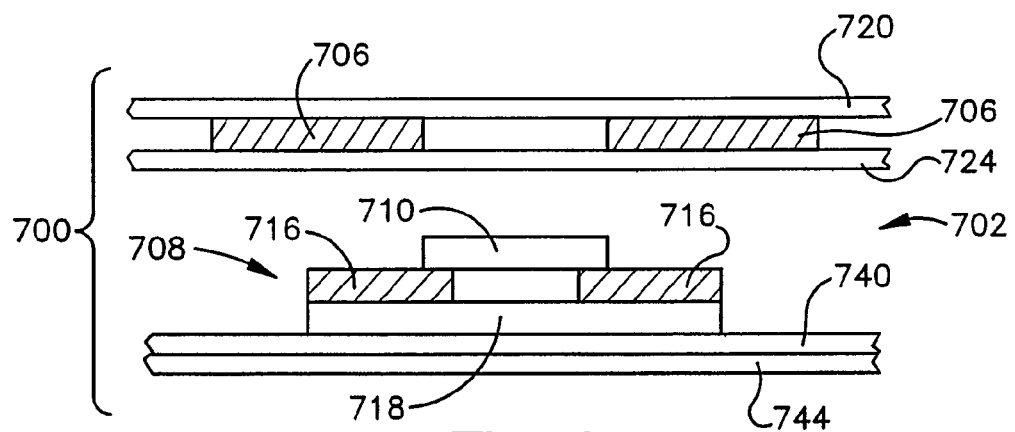
FIG. 24 is a cross-section side view of part of a fifth embodiment capacitive-coupling RFID inlay of the present invention.

FIG. 24 shows another embodiment of the RFID device 700, in which the antenna 706 is coupled to the label facestock 720. The dielectric layer 724 on the antenna 706 may be any of a variety of types of layers, such as a printed non-conductive film, a tape coated with a pressure-sensitive adhesive on both sides, or simply a layer of pressure-sensitive adhesive.

The interposer 708 is adhered to an adhesive layer 740, which is supported by and covered by a release liner 744. The release liner 744 may be a suitable silicone-coated material that may be pulled off to reveal the underlying adhesive layer 740.

The RFID device 700 shown in FIG. 24 may be fabricated by printing the antenna 706 on the label facestock 720, then printing or otherwise coating at least a portion of the antenna 706 with the dielectric layer 724. A pick-or-place operation or other operation is used to place the interposer 708 on the adhesive layer 740. Then the two parts of the RFID device 700 may be laminated together, forming the RFID device 700. Following lamination, the RFID device may be adhered to an object by removing the release liner 744, and pressing the adhesive layer 740 onto the object.

Figure 25A:
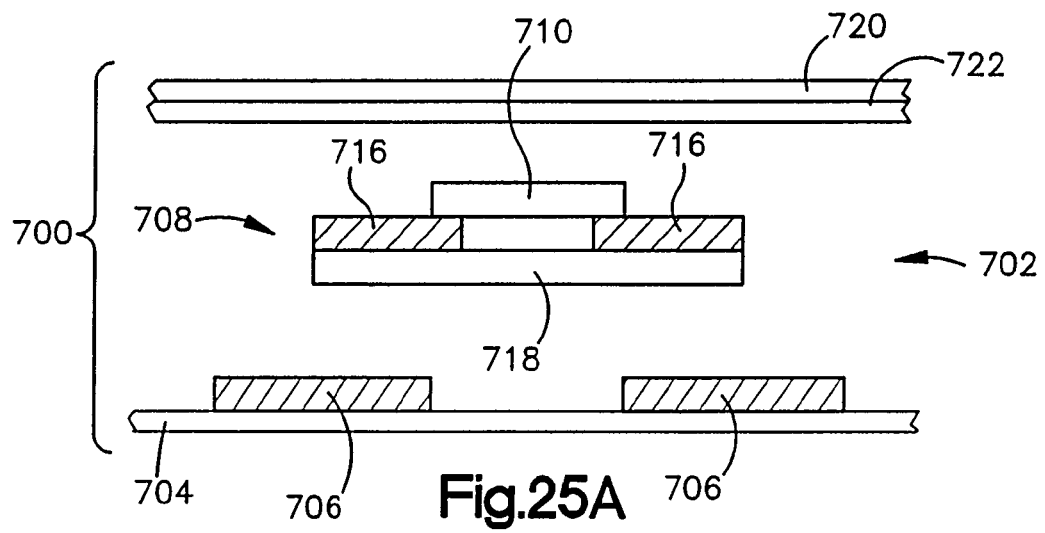
FIG. 25A is a cross-section side view of part of a sixth embodiment capacitive-coupling RFID inlay of the present invention.

FIG. 25A shows a further embodiment of the RFID device 700, with the adhesive layer 722 on the label facestock 720, being used to secure the interposer 708 against the antenna 706. The interposer 708 is in a face-up configuration such that the interposer substrate 718 is between the interposer leads 716 and the antenna 706. The interposer leads 716 and the antenna 706 are thus capacitively coupled together across the dielectric interposer substrate 706.

It will be appreciated that other capacitive coupling configurations for the RFID device 700 are possible. For example, there may be some contact between the interposer leads 716 and the antenna 706, but insufficient contact to allow for conductive coupling between the interposer leads 716 and the antenna 706.

Figure 25B:
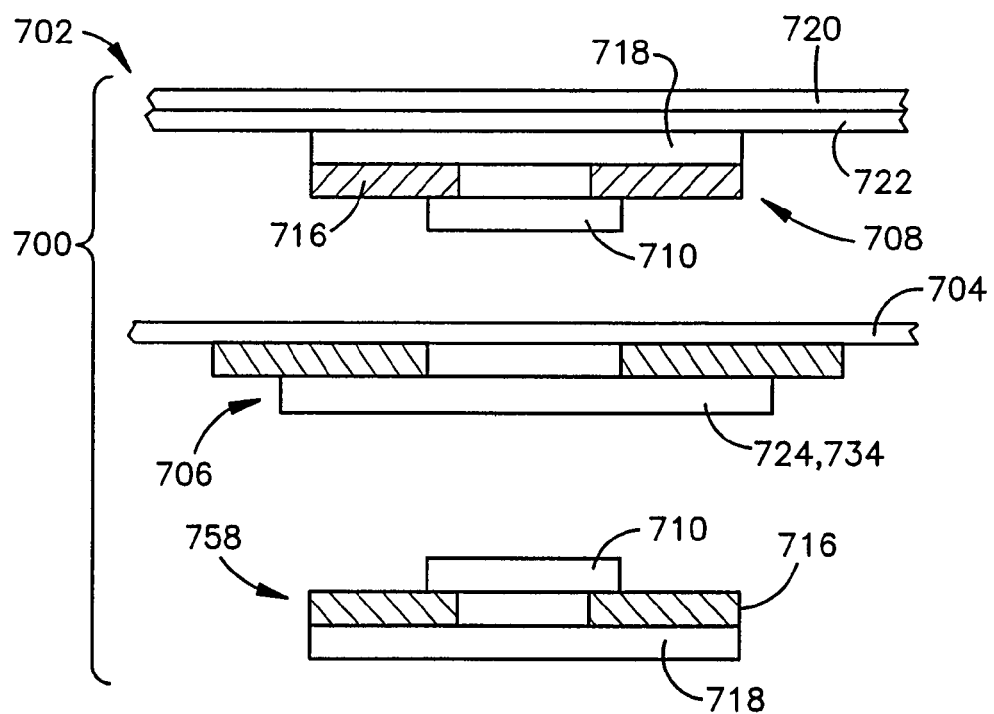
FIG. 25B is a cross-section side view of part of a seventh embodiment capacitive-coupling RFID inlay of the present invention.

It will be appreciated that many of the above embodiments may be combined together in various suitable ways. For example, multiple interposers or interposers may be capacitively coupled to a single antenna. One of the interposers may be on the same side of the antenna substrate as the antenna, being coupled to the antenna such as shown in FIG. 23, the other of the interposers on an opposite side of the antenna substrate, being coupled to the antenna such as shown in FIG. 22. Such a configuration utilizing multiple interposers is illustrated in FIG. 25B, wherein the interposers 708 and 758 are coupled to the same antenna 706, on opposite sides of an interposer substrate 718.

Figure 26:
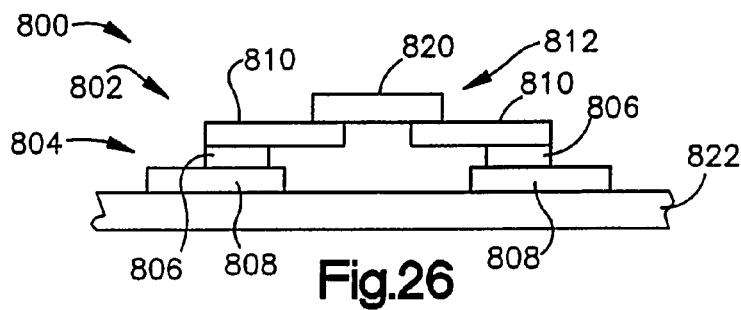
FIG. 26 is a cross-section side view of part of a eighth embodiment capacitive-coupling RFID inlay of the present invention.
Figure 27:
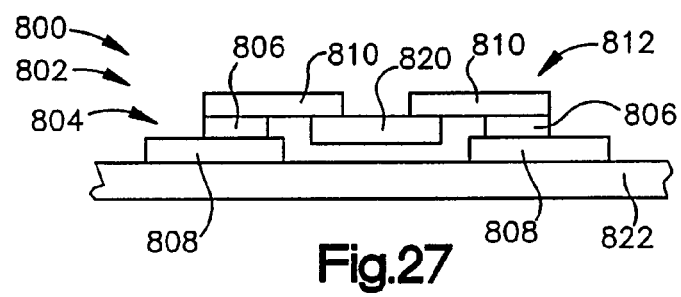
FIG. 27 is a cross-section side view of part of a ninth embodiment capacitive-coupling RFID inlay of the present invention.

FIGS. 26 and 27 show two other types of RFID devices 800 having inlays 802, each with a capacitive coupling 804. In each of the devices 800 the capacitive coupling 804 is made across dielectric layers or pads 806, which are located between an antenna 808, and conductive interposer leads 810 of interposers or interposers 812. The conductive leads 810 are coupled to contacts of a chip 820, which may be similar to chips described above with regard to other embodiments. In each of the embodiments, the antenna 808 is coupled to (formed on) a suitable substrate 822.

In the embodiment shown in FIG. 26, the chip 820 is in a "chip up" configuration, with the chip 820 coupled to a side of the interposer leads 810 away from the antenna substrate 822. In the embodiment shown in FIG. 27, on the other hand, the chip 820 is in a "flip chip" or "chip down" configuration, with the chip 820 being between the dielectric pads 806.

The dielectric pads 806 may be any of a variety of suitable dielectric materials for attaching and capacitively coupling the conductive interposer leads 810 to the antenna 808. Broad categories of suitable dielectric materials include dielectric adhesives, such as pressure-sensitive adhesives, and non-conductive polymers. It will be appreciated that dielectric adhesives may have advantages over electrically conductive adhesives, which have been used in the past to attach chips, interposers, or interposers to antennas. One potential advantage of non-conductive adhesives is lower cost. Another potential advantage is the avoidance of the long curing times that may be required with conductive adhesives. Long curing times increase production time, and thus production costs.

As discussed further below, it is desirable that the electrical characteristics of the antenna 808, the chip 820, and the dielectric pads 806 be such that the chip 820 and the antenna 808 are well matched in operation, that is, that maximum power may be transmitted from the chip 820 to the antenna 808. More particularly, the capacitive coupling between the antenna 808 and the chip 820 may be such that the same antenna 808 would be suitable for either conductive or capacitive coupling to the chip 820.

Figure 28:
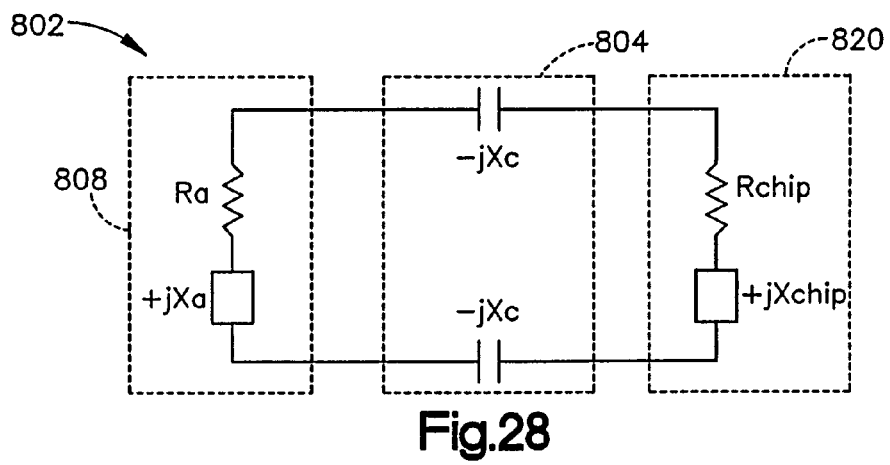
FIG. 28 is a circuit diagram of the inlays of FIGS. 26 and 27.

For both of the embodiments in FIGS. 26 and 27, the RFID device 800 has the equivalent electrical circuit shown in FIG. 28. In the circuit shown in FIG. 28, the contributions to impedance of the system are expressed as a composite of two parts; a resistance, R, expressed in ohms, and a reactance, X, also expressed in ohms, but with a "j" factor in front to express the fact that reactance is a vector quantity. The value of jX can be either capacitive, where it is a negative number, or inductive, where it is a positive number. The chip 820 has a resistance $R_{chip}$ and an inductive reactance $+jX_{chip}$. The antenna 808 likewise has a resistance Ra and an inductive reactance $+jX_a$. The dielectric pads 806 each have a capacitive reactance $-jX_c$.

The two parts of the impedance of the antenna 808 have different effects on the antenna's suitability or performance in a particular situation. The resistance $R_a$ is actually a composite of two things; the loss resistance of the antenna 808, representing the tendency of any signal applied to it to be converted to heat, and the radiation resistance, representing energy being "lost" out of the antenna 808 by being radiated away, which is what is desired in an antenna. The ratio of the loss resistance and the radiation resistance is described as the antenna efficiency. A low efficiency antenna, with a large loss resistance and relatively small radiation resistance, will not work well in most situations, as the majority of any power put into it will simply appear as heat and not as useful electromagnetic waves.

The effects of reactance X are slightly more complex than that for resistance R. Reactance X, the inductive or capacitive reactance of an antenna, does not dissipate energy. In fact, it can be lessened, by introducing a resonant circuit into the system. Simply, for a given value of +jX (an inductor), there is a value of –jX (a capacitor) that will resonate and/or cancel the effect of the inductor, leaving just the resistance R.

Thus in general, for conductive coupling, it is desirable that there be impedance matching between the chip and the antenna, such that $R_{chip}=R_a$ and $X_{chip}=-X_a$. This situation (conductive coupling) corresponds to that illustrated in FIG. 26, but with $X_c=0$.

Figure 29:
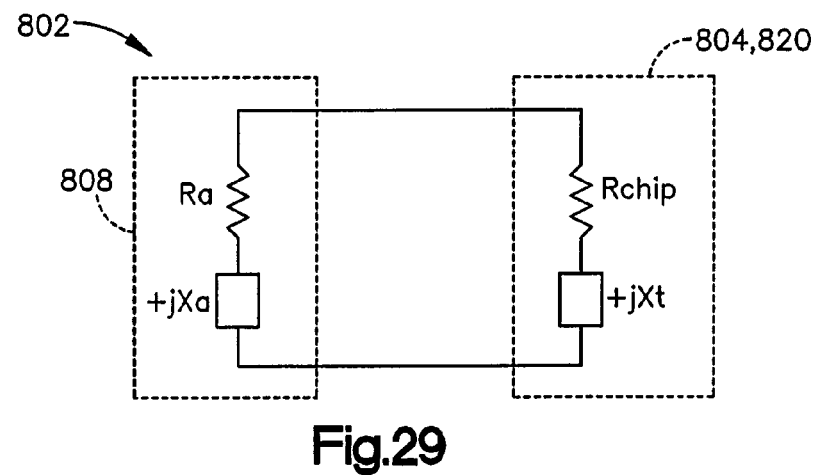
FIG. 29 is another circuit diagram of the inlays of FIGS. 26 and 27.

For capacitive coupling between the chip 820 and the antenna 808, the impedance matching between the chip and the antenna must be modified to take into account the effect of the capacitive coupling 802. FIG. 29 shows an equivalent circuit that takes into account the capacitance of the capacitive coupling 804 by substituting a modified total reactance $+jX_t$ for the reactance $+jX_{chip}$ of the chip 820, where:

$$jX_t = \frac{jX_{chip} \times jX_c}{jX_{chip} + jX_c/2} \quad (1)$$

Impedance matching for the inlays 802 is achieved when $R_a=R_{chip}$ and $jX_a=-jX_t$.

As discussed above, it would be desirable for the antenna 808 to be suitable for coupling both capacitively and conductively to the chip 820. In order for the same impedance matching to be optimum for both capacitive and conductive coupling $X_t$ must approach $X_{chip}$. When $X_{chip}$ is much less than $X_c$, then $X_t \approx X_{chip}$. So it may be desirable to make $X_c$ large, so that it is at least much greater than $X_{chip}$.

The capacitance $X_c$ of the capacitive coupling 804 is given by a parallel plate capacitance formula:

$$X_c = \frac{\varepsilon_r \varepsilon_0 A}{t} \quad (2)$$

where is $\varepsilon_0$ is the permittivity constant, $\varepsilon_r$ is the dielectric constant of the dielectric material (the dielectric pad 806), A is the overlapping areas of the antenna 808 and the interposer leads 810 opposite one another (area of capacitor plates), and t is the thickness of the dielectric pad 806.

It will be appreciated that the capacitance $X_c$ may be increased in one or more of three ways: 1) by increasing the area of the capacitive coupling 804; 2) by decreasing the thickness of the dielectric pads 806; or 3) by increasing the dielectric constant of the dielectric pads 806. It will be appreciated that the area available for the capacitive coupling 804 may be limited, such as by manufacturing limitations on interposer dimensions, so that it may be impractical to increase the coupling area above a certain amount. For example, the coupling area may have a practical size limitation of about 72 mm² (0.125 in²), which corresponds to two areas of overlap that are each 6 mm×6 mm (0.25 inches×0.25 inches).

With regard to decreasing the thickness of the dielectric pads 806, it will be recognized that practical limits may exist for providing repeatable thicknesses of dielectric material that can be used to adhere the antenna 808 and the interposer leads 810 together. However, thicknesses of down to about 0.001 inches (0.025 mm) of dielectric pressure-sensitive adhesive may be achieved. It may be possible to reduce the thickness of pressure-sensitive adhesive layers even further, say to about 0.0005 inches (0.013 mm). By dispensing pressure-sensitive adhesive directly onto the antenna 808, it may be possible to reduce the thickness of the adhesive layer to about 0.0001 inches (0.0025 mm), or even to 0.00008 inches (0.002 mm). Thus the thickness of the dielectric pads may be less than about 0.025 mm (0.001 inches), may be less than about 0.013 mm (0.0005 inches), and may be about 0.0025 mm (0.0001 inches) or less.

Some example values for the capacitance $X_c$ are given in the table below:

| A (in², mm²) | $\varepsilon_r$ | t (in, mm) | Xc (pF) |
| --- | --- | --- | --- |
| 0.0078 (5) | 3.03 | 0.00055 (0.014) | 9.4 |
| 0.0078 (5) | 2.97 | 0.00045 (0.012) | 11.7 |
| 0.063 (40) | 3 | 0.0005 (0.013) | 84 |
| 0.0064 (4) | 3 | 0.0005 (0.013) | 8.6 |

Typical RFID chip capacitances may be in the range of about 0.3 to about 1.2 pF. Using these values for $X_{chip}$, and the above values of $X_c$, the total capacitance $X_t$ is from about 87% to nearly 100% of the chip capacitance $X_{chip}$. Thus it is possible to configure capacitive couplings that allow impedance matching to antennas that also can substantially match the impedance of the same chip using a conductive coupling between chip and antenna. The same antenna may be employed for either capacitive or conductive coupling, with similar read performance (such as having a similar range for reading or other detection of the RFID device).

However, it will be appreciated that some variation in performance may occur as the capacitance $X_c$ of the capacitive coupling 804 changes. In one example, the matching frequency between the antenna 808 and the chip 820 was found to vary between 902 MHz and 925 MHz as the capacitance of the capacitive coupling 804 varied from 11.57 pF to 9.47 pF.

The inlays 802 shown in FIGS. 26 and 27 may include any of a variety of suitable materials for their various parts. The antenna 808 may include suitable conductive materials such as copper or silver. The dielectric pads 806 may include suitable dielectric adhesives or non-conductive polymers. Examples of suitable adhesives for the dielectric pads 806 include pressure-sensitive adhesives such as Fasson adhesives S4800 and S333, available from Avery Dennison Corporation. Alternatives adhesives include thermoset non-conductive adhesives such as epoxies, and thermoplastic hot-melt adhesives. It will be appreciated, however, that other suitable materials may be used for the dielectric pads 806. Examples of suitable non-conductive polymers include Emerson & Cuming 12873-47G, available from Emerson and Cuming, of Billerica, Mass., USA, and Dello MONOPOX MK045, available from Dello Industrial Adhesives, of Landsberg, Germany.

As suggested above, one way that the capacitance $X_c$ of the capacitive coupling 804 may be increased is by increasing the dielectric constant of the material of the dielectric pads 806. Various pressure-sensitive adhesives have been found to have dielectric constants ranging from about 2.5 to about 4.2. Increasing the dielectric constant may be accomplished by adding a high-dielectric material to a dielectric adhesive such as a dielectric pressure-sensitive adhesive or a non-conductive polymer. Examples of suitable additives include titanium compounds such as titanium dioxide (rutile crystal form) and barium titanate ($BaTiO_3$). Titanium dioxide has a dielectric constant of about 100 at 100 MHz. Barium titanate has a dielectric constant of 600 at 3 GHz. For example, it is estimated that adding 5% by volume of barium titanate to a pressure-sensitive adhesive increases the dielectric constant of the material from 3 to 33, while adding 10% by volume barium titanate increases the dielectric constant to 63. Similar or greater volume percentages of barium titanate may be included in the dielectric material of the dielectric pads 806.

It has been found effective to add barium titanate to a non-conductive epoxy (a non-PSA), such as well-known two-part epoxy. Good read performance has been achieved with interposer/antenna couplings of non-conductive epoxies and non-conductive pressure-sensitive adhesives. Read performance for such couplings has been found to be comparable to that of conductive couplings of inherently conductive polymer compounds with conductive silver flakes added.

One configuration that was tested included an inlay with a 4-mm thick foam antenna substrate with a 5 mm×98-108 mm copper or silver dipole antennas (with a thickness of 10 microns (silver) or 36 microns (copper)) on one side of the substrate, and an aluminum foil ground plane on the other side of the substrate. Interposers having dimensions of 2 mm×2.5 mm were adhered to such antenna/substrate structures using various types of materials, both conductive and non-conductive. An inherently conductive polymer (ICP), a non-conductive paste (NCP), and non-conductive pressure-sensitive adhesives (PSAs) were all tested for adhering the interposer to the antenna. The NCP used was Emererson & Cumming EC-12873-47G, with 7 mil spacers. The ICP used was Emerson & Cumming XCE3110 (containing 1 micron×5 micron silver flakes). One PSA (Aeroset) was manufactured by Ashland Specialty Chemical Company of Dublin, Ohio, while the other PSAs were manufactured by Avery Dennison. The PSAs had various monomers added, such as 2-Ethyl Hexyl Acrylate (2EHA), Butyl Acrylate (BA), Vinyl Acetate (Vac), Methyl Acrylate (MA), Acrylic acid (AA), and Glycidyl Methacrylate (GMA). Appropriate tuning was performed, if necessary, to give a resonant frequency of 905-925 MHz for each sample. Reading was done at a scan frequency of 800 MHz to 1 GHz. The initial read distance at which 95% accuracy could be obtained was recorded. Results for the testing are given in the table below:

| Adhesive | Type All Acrylic (except NCP and ICP) | Monomers | Thickness micron | Remark | Antenna Length (mm) | Read Distance (Ft) | Dielectric Constants | Dielectric Loss |
|---|---|---|---|---|---|---|---|---|
| S3333 (or AE-3396C) | Emulsion | 2EHA/BA/MAA/AA | 21 | | Cu: 104 | 12.5 | 4.175 | 0.0455 |
| | | | | | Ag: 106 | 12.5 | | |
| S4800 (Aroset 3510) | Emulsion | Proprietary | 34 | Tackified | Cu: 106 | 12.5 | 3.542 | 0.0427 |
| | | | | | Ag: 107 | 12.5 | | |
| S730 | Solvent | 2EHA/Vac/AA | 23 | | Cu: 105.5 | <5 | 3.026 | 0.0198 |
| S2501 | Emulsion | BA/2EHA/Vac/MAA/AA | NA | Tackified | Not stable | NA | NA | |
| LP430 (or S490) | Emulsion | 2EHA/Vac/MAA/AA | NA | | Not stable | NA | 2.485 | 0.0117 |
| P902 | Emulsion | BA/2EHA/Vac/MAA/AA | 22 | Tackified | Not Stable | NA | 2.925 | 0.0495 |
| I-676 | Solvent | 2EHA/Vac/MA/AA | 12 | | Not stable | NA | 3.640 | 0.0252 |
| I-696 | Solvent | 2 EHA/MA/AA/GMA | 12 | | Not Stable | NA | 3.114 | 0.0293 |
| NCP | Epoxy | | | | Ag: 100 | 12.5 | | |
| ICP | Epoxy | | | | Cu: 98.5 | 12.5 | | |
| | | | | | Ag: 98.5 | 12.5 | | |
| Sigma Transfer Tape | | | | | Cu: 105 | 12.5 | | |

As can be seen from the results, the NCP and two of the PSAs achieved read results comparable to those of ICP.

The capacitive coupling 804 has been described heretofore as involving ideal plates of the same size, parallel to and aligned with one another, and not having any edge effects due to the finite size of the plates. However, it will be appreciated that certain non-ideal situations may be encountered in actual practice.

For example, there may be misalignment of the antenna 808 and the conductive interposer leads 810 that affects the effective coupling area. Such misalignment may involve relative displacements of the antenna 808 and the conductive interposer leads 810 within their planes (x-y displacements), such that the conductive interposer leads 810 are not centered or located as desired relative to corresponding portions of the antenna 808. Another type of misalignment may involve the conductive interposer leads 810 being non-parallel relative to the corresponding portions of the antenna 808 (angle misalignments within their planes).

Other difficulties may arise from non-uniformities in the thicknesses of the dielectric pads 806. For example, where the dielectric pads 806 are pressure-sensitive adhesive pads, variations in the force used to activate the adhesive may cause variations in the thickness of the pads, both in terms of thickness variations within a single pad and in variations between different pads. It will be appreciated that it would desirable for such non-ideal conditions to be avoided or to be minimized within acceptable tolerances, and/or for the capacitive coupling 804 to be able to be self-compensating, so as to reduce the effect of non-ideal conditions.

Figure 30:
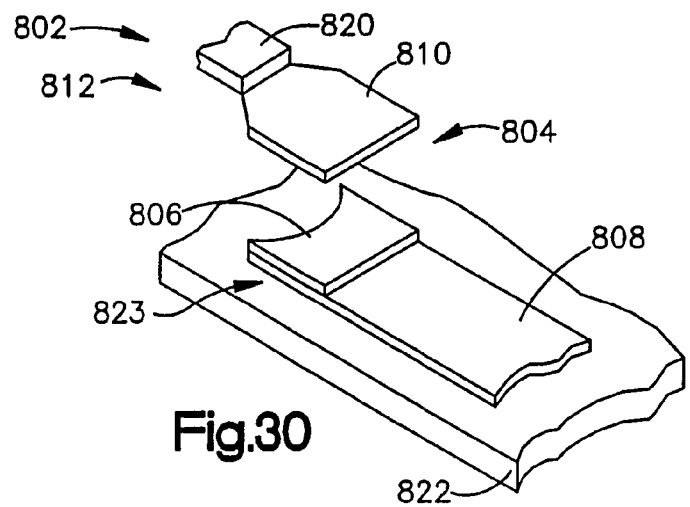
FIG. 30 is an oblique exploded view of part of one embodiment of the capacitive coupling of the inlays of FIGS. 26 and 27.

One way to reduce the effects of misalignment of the conductive interposer leads 810 relative to the antenna 808 is to make some range of overlap between the two, so that precise alignment is not necessary. FIG. 30 shows an example of such an overlap, wherein the antenna portions 823 capacitively coupled to the interposer leads 810, are larger than the interposer leads 810. The antenna portions 823 may have a rounded concave shape, which makes for reduced variation in the overlap area if there is angle misalignment of the interposer leads 810.

Figure 31:
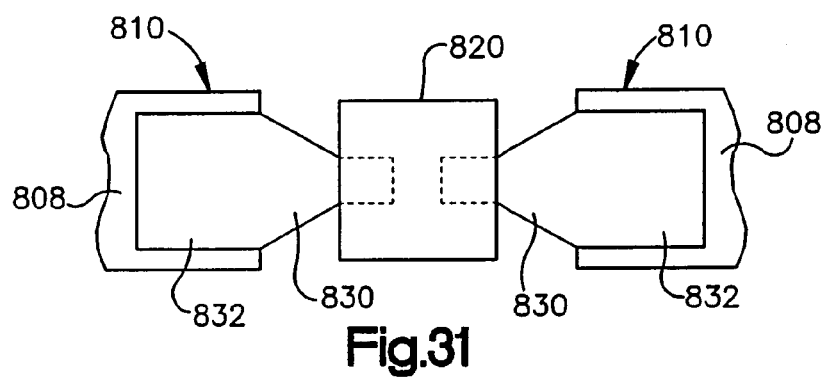
FIG. 31 is a plan view of another embodiment of a capacitive coupling in accordance with the present invention.
Figure 32:
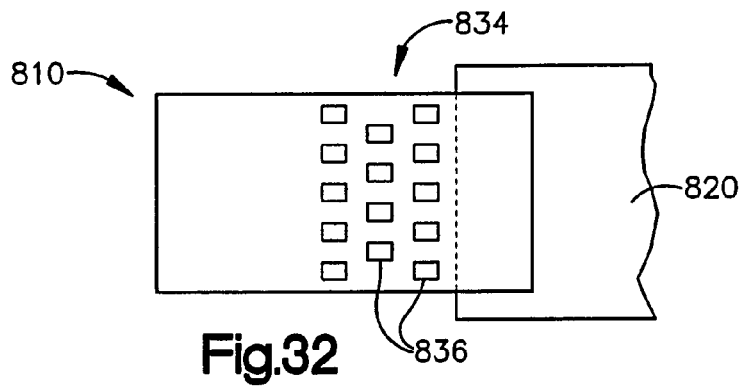
FIG. 32 is a bottom of part of an interposer of the present invention usable in capacitive coupling.

It will be appreciated that the conductive interposer leads 810 may also be configured so as to reduce the effect of misalignment between the conductive interposer leads 810 and the antenna 808, on the effective coupling area A. FIGS. 31 and 32 show examples of various ways of configuring the conductive interposer leads 810 to achieve this. In FIG. 31, the conductive interposer leads 810 have tapered portions 830 with a non-uniform width, with the width in the tapered portions 830 being less than that in coupling portions 832 that are used to capacitively couple the interposer leads 810 to the antenna 808. Misalignment of the interposer leads 810 in a left-right direction in FIG. 31 causes some change in the coupling capacitance, due to the decrease in coupling area for one of the interposer leads 810 and a increase in the coupling area for the other of the interposer leads 810. However, the change in coupling areas will be less than if the interposer leads 810 had a uniform width along their length, since the tapered portions 830 have less width per unit length. Therefore, the inclusion of the tapered portions 832 reduces the effect of some types of angle misalignment on conductive coupling.

Another configuration for reducing effects of misalignment on the effective coupling area A is illustrated in FIG. 32, where the conductive interposer leads 810 have reduced conductive material portions 834 which have openings, gaps, or apertures 836 in the conductive material. The effective coupling area is proportional, at least to a first approximation, to the overlapping area of the interposer leads 810 that covered by conductive material. By omitting the conductive material from parts of the reduced conductive material portions 834, the effective area of those portions is reduced. Therefore misalignment of the interposer 812 that brings the reduced conductive material portions 834 into coupling with the antenna 808 has less of an effect on coupling capacitance than if the apertures 836 in the conductive material were not present. It will be appreciate that the apertures 836 may have any of a variety of suitable shapes, such as round, square, elliptical, or rectangular.

It will further also be that the configurations illustrated in FIGS. 31 and 32 may be characterized as having the common feature that portions of the interposer leads that are not normally coupled to the antennas 808 have a reduced effect area per unit length, when compared with portions of the interposer leads 808 that are normally capacitively coupled to the antenna 808.

Figure 33:
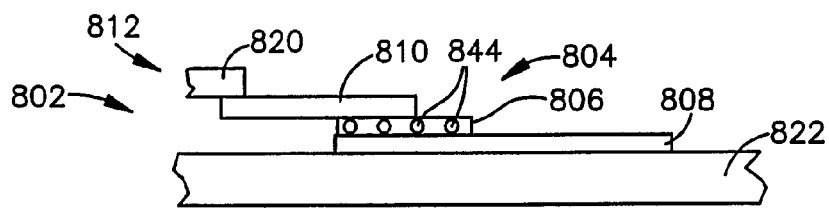
FIG. 33 is a cross-section side view of another embodiment capacitive coupling of the inlays of FIGS. 26 and 27.

FIG. 33 illustrates another variation of the capacitive coupling 804 shown in FIGS. 26 and 27, with separation between the antenna 808 and the conductive interposer lead 810 being maintained by spacers 844 that are part of the dielectric pad 806. The spacers 844 may be utilized in the dielectric pad 806 in conjunction with a non-conductive polymer. The spacers 844 may be pre-blended in the polymer material. Alternatively, the spacers may be dry-sprayed onto a non-conductive polymer that has already been applied to the antenna 808 and/or the conductive interposer lead 810. It will be appreciated that the spacers 844 may also be utilized in conjunction with other dielectric materials, such as pressure-sensitive adhesives. Examples of suitable spacers include Micropearl SP-2055 µm spacers available from Sekisui Fine Chemical Co. of Japan, and 7.7 µm fiber spacers (Product 111413) available from Merck. It will be appreciated that using the spacers 824 may aid in obtaining accurate and consistent spacing between the antenna 808 and the conductive interposer leads 810 of the RFID devices 800.

It also may be possible for the dielectric pads 806 to include a material that has an effective dielectric constant that varies as the thickness of the material varies. Thus the effective dielectric constant of the material would be non-constant, although it will still be referred to herein as a "constant." For example, the dielectric pads 806 may include a material that reduces its dielectric constant as it is compressed. Thus if the material were to be made thinner, for example by a larger-than-normal force for pressing the interposer 812 onto the antenna 808, the material would have a reduced dielectric constant. This reduction in dielectric constant would mitigate to some extent the effect on the coupling capacitance $X_c$ of the reduction in thickness of the dielectric material. Thus use of a dielectric material that is at least to some extent self-compensating for thickness may aid in reducing variations in coupling capacitance $X_c$.

One way of having a dielectric material with a dielectric constant that is a function of thickness is to distribute particles within the dielectric material that affect the dielectric constant of the material. As the material is compressed, the particles are redistributed, causing a change in the dielectric constant of the material. For example conductive metal particles, such as aluminum or nickel particles, may be added to a dielectric material. As the material is compressed, the distance between the particles is reduced, thereby also reducing the dielectric constant. It will be appreciated that the addition of such particles, if done at small enough concentration, will not change the overall dielectric character of the material. That is, conductive particles may be suitably added without making the material itself electrically conducting. The particles may be in powder form, and may have any of a variety of suitable particle sizes, including sub-micron sizes.

It will also be appreciated that adding conductive particles to the dielectric material of the dielectric pads 806 may also reduce the effective thickness of the dielectric pads 806. That is, the conductive particles may cause the dielectric pads 806 to effectively have a smaller thickness than their actual thicknesses. Oxidation on the surfaces of the particles may even prevent conductivity between particles, should the particles touch.

Other sorts of particles may be added to the dielectric pads 806 to achieve any of a variety of effects on conductive coupling. Examples of materials for particles that may be added to the dielectric pads 806 include mixtures of metal spheres and dielectric spheres, particles that include both metal and ceramic, and metal spheres with surfaces oxidized or otherwise converted to high dielectric materials (e.g., titanium particles oxidized to a given surface depth). Layers of metal and ceramic may also be employed.

Another way of having the capacitive coupling 804 compensate for thickness is to have an effective area, between the antenna 808 and the conductive interposer lead 810, that varies as a function of the separation of the antenna 808 and the conductive interposer lead 810 (the thickness of the dielectric pads 806). The effective area is defined herein as the equivalent parallel-plate capacitor area from the equation (1) above. The effective area may differ from the facing area of the antenna 808 and the conductive interposer lead 810 because of fringing capacitance or edge effects, effects due to the antenna 808 and the conductive interposer lead 810 not being infinite flat plates. The impact of fringing capacitance will depend on the separation between the antenna 808 and the conductive interposer leads 810 (the thickness of the dielectric pads 806). Decrease of the effective area as the antenna 808 and the conductive interposer leads 810 are moved closer together aids in reducing variations in coupling capacitance $X_c$, as the thickness of the dielectric pads 806 changes.

Figure 34:
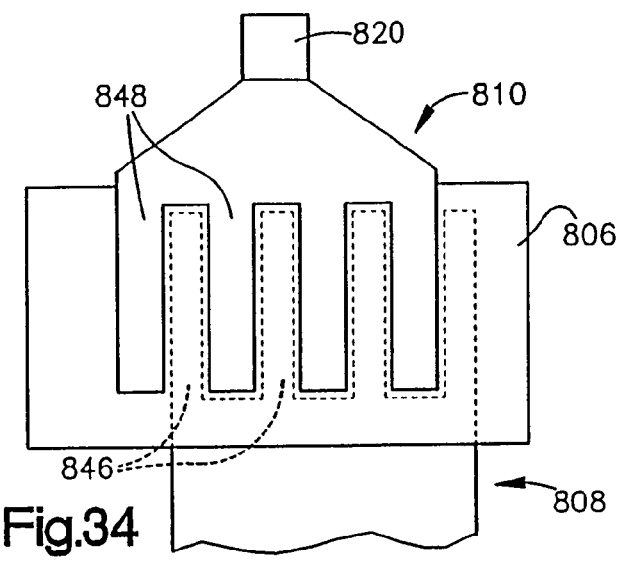
FIG. 34 is a plan view of yet another embodiment of a capacitive coupling in accordance with the present invention.
Figure 35:
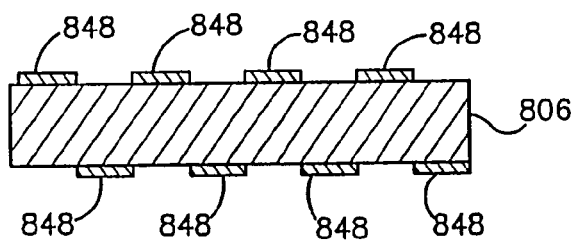
FIG. 35 is a cross-sectional side view of the capacitive coupling of FIG. 34, with a relatively thick dielectric pad.

FIG. 34 shows a plan view of one possible configuration with an effective coupling area that depends on thickness. The antenna 808 and the interposer leads 810 have respective interdigitated fingers 846 and 848 of conductive material, on respective opposite sides of the dielectric pad 806. At relatively large thicknesses of the dielectric pad 806, as illustrated in FIG. 35, the fingers 846 and 848 may interact with one another as parallel plate capacitors, with effective area approaching the actual area of the fingers 846 and 848. However, as the thickness of the dielectric pad 806 is reduced, the effective area of the fingers 846 and 848 decreases, as the ratio of the thickness to the offset distance of the fingers 846 and 848 decreases. In the limit case, illustrated in FIG. 36, as the thickness of the dielectric pad 806 is very much less than the offset distance of the fingers 846 and 848, there is only capacitive couple of the edge regions of the fingers, and the effective area for purposes of capacitive coupling becomes a small percentage of the actual area of the fingers 846 and 848. Thus, the effect of a reduction in dielectric thickness, which tends to raise the capacitance, is offset in at least some extent by the reduction of effective area of the capacitive coupling.

Figure 36:
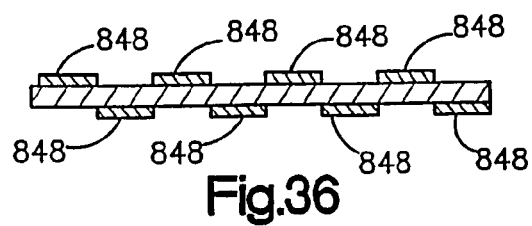
FIG. 36 is a cross-sectional side view of the capacitive coupling of FIG. 34, with a relatively thin dielectric pad.

It will be appreciated that the configuration illustrated in FIGS. 34-36 and described above is but one of a variety of configurations that have reduced effective area of capacitive coupling as the thickness of a dielectric layer is reduced. Configurations that change effective capacitive coupling area with thickness may be configurations that have portions of the antenna 808 and/or the interposer leads 810 that are on opposite sides of the dielectric pad 806, but do not overlap directly with one another, although there may be some partial overlap of conductive material.

Figure 37:
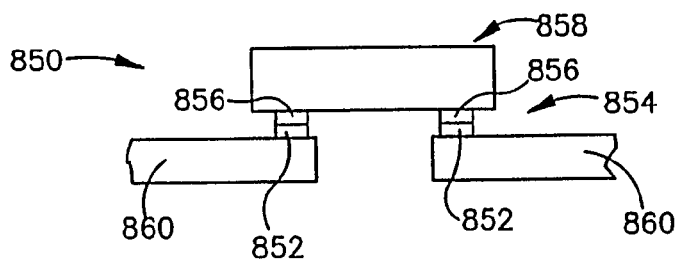
FIG. 37 is a cross-section side view of a capacitive coupling of the present invention, between a chip and conductive leads of an interposer or strap.

FIG. 37 illustrates another type of capacitive coupling, showing an interposer or strap 850 with dielectric pads 852 making a capacitive coupling 854 between contacts 856 of a chip 858 and conductive interposer leads 860. The dielectric pads 852 may use similar materials to those described above with regard to the dielectric pads 806.

As one example of such a coupling, the contacts 856 may each be about 30 μm (microns) by 30 μm. The dielectric pads 852 may have a thickness of about 2 μm, and the dielectric material of the dielectric pads 852 may have a dielectric constant of about 300.

Figure 38:
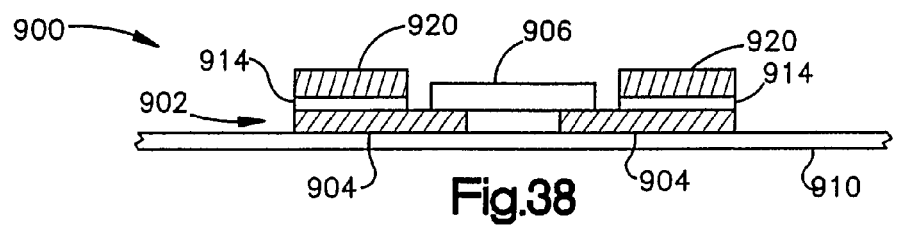
FIG. 38 is a cross-section side view showing one embodiment of a coupling between an interposer and a printed antenna, in accordance with the present invention.
Figure 39:
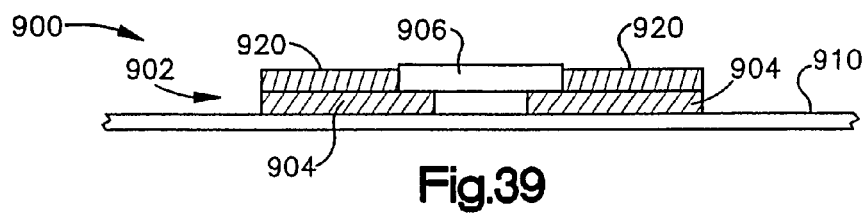
FIG. 39 is a cross-section side view showing another embodiment of a coupling between an interposer and a printed antenna, in accordance with the present invention.

FIGS. 38 and 39 show two variations of an RFID inlay 900 in which an interposer 902, having interposer leads 904 coupled to a chip 906, is mounted on a substrate 910. The interposer 902 may be adhesively coupled to the substrate 910, or may be coupled to the substrate 910 by other suitable methods.

Dielectric pads 914 may optionally be placed on the interposer leads 904 (FIG. 38), or may be omitted (FIG. 39). The dielectric pads 914 may be parts of a layer of dielectric material deposited over the interposer 902 and the substrate 910. An antenna 920 is then printed or otherwise formed, so as to overlap the interposer leads 904. With reference to FIG. 38, the antenna 920 may be capacitively coupled to the interposer leads 904 across the dielectric leads 914. Alternatively, with reference to FIG. 39, the antenna 920 may be directly conductively coupled to the interposer leads 904.

Inlay with Chip in Substrate Hole

Figure 40:
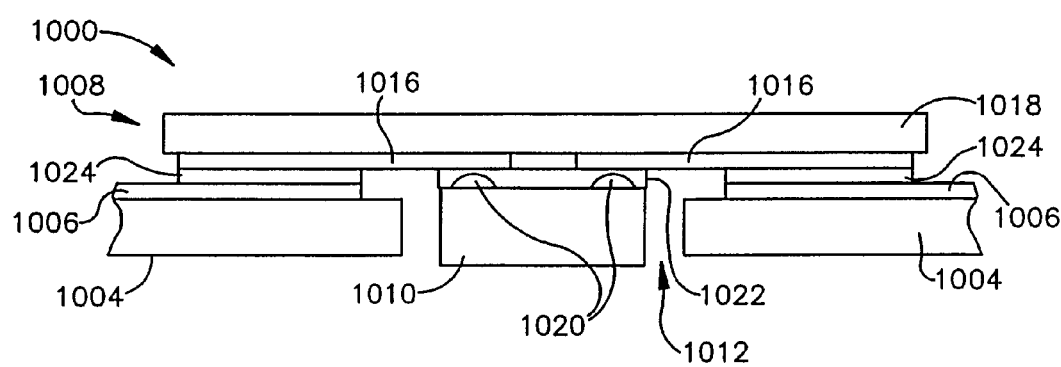
FIG. 40 is a cross-section side view of part of another embodiment RFID inlay of the present invention.

FIG. 40 shows an RFID inlay 1000 in which an interposer 1008 is in a "chip down" or "flip chip" configuration, wherein a chip 1010 of the interposer 1008 at least partially within a hole 1012 in an antenna substrate 1004. The interposer 1008 includes an interposer substrate 1018 upon which interposer leads 1016 are located. Conductive bumps 1020 of the chip 1010 are coupled to the interposer leads 1016 by one or more chip/interposer couplings 1022. The chip/interposer coupling (s) 1022 may be direct or non-direct coupling(s), such as by either being direct conductive couplings or one or more non-direct capacitive couplings.

The interposer leads 1016 are operatively and mechanically coupled to portions of an antenna 1006 by interposer/antenna couplings 1024. As with the chip/interposer couplings 1022, the interposer/antenna couplings 1024 may be any of a variety of suitable direct or non-direct couplings, such as the couplings described herein.

The antenna 1006 is located on the antenna substrate 1004. As noted above, the antenna substrate 1004 has the hole 1012 therein, for receiving at least a portion of the interposer 1008 therein. For example, as shown in FIG. 40, a majority of the chip 1010 is located within the hole 1012. Part of the chip 1010 extends below the hole 1012, and part of the chip 1010 extends above the hole 1012. It will be appreciated that the chip 1010 may be located otherwise with regard to the hole 1012, for example with none of the chip 1010 extending below the hole 1012, or with all or part of the conductive bumps 1020 extending into the hole 1012. The hole 1012 may be suitably punched or otherwise formed in the antenna substrate 1004.

It will be appreciated that the inlay 1000 offers several advantageous features. First, the overall thickness of the inlay 1000 may be kept to a minimum by placing part of the interposer 1008 in the hole 1012. Related to that advantage, placement of part of the interposer 1008 in the hole 1012 may facilitate use of a "flip chip" configuration with capacitive coupling, since the performance of capacitive couplings may be enhanced by making the dielectric coupling layers thin, and since it may be difficult to accommodate the thickness of the chip 1010 other than by locating at least part of it in the hole 1012 or a suitable recess. In addition, placement of the interposer 1008 in a flip chip configuration with the chip 1010 at least partially in the hole 1012 allows the coupled portions of the interposer leads 1016 and the antenna 1006 to be substantially flat and/or substantially parallel to one another. This advantageously reduces stresses on the interposer/antenna couplings 1024. Further, an RFID tag or label incorporating the inlay 1000 will tend to have a smoother, more even profile, thereby facilitating printing of the tag or label.

Figure 41:
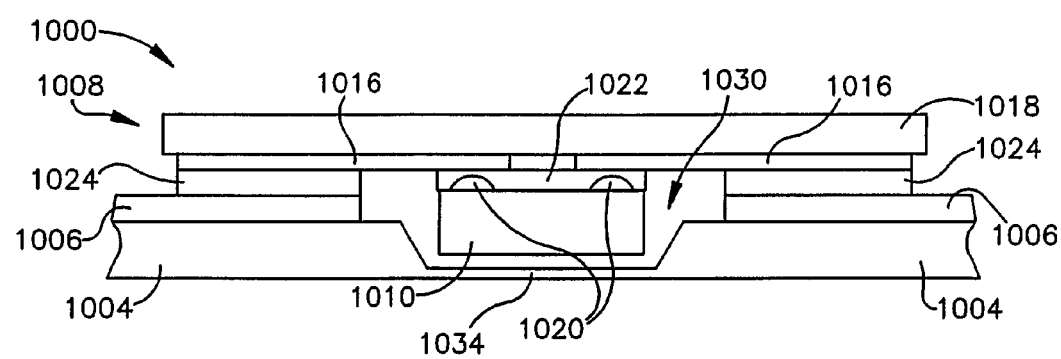
FIG. 41 is a cross-section side view of part of yet another embodiment RFID inlay of the present invention.

FIG. 41 shows an alternative configuration of the inlay 1000, with the chip 1010 at least partially in a recess 1030 in the antenna substrate 1004. The recess 1030 does not extend all the way through the antenna substrate 1004, with a thinned portion 1034 of the antenna substrate remaining under the recess 1030. The recess 1030 may be formed in any of a variety of suitable ways, such as by roll pressing with a suitably configured roll.

It will be appreciated that the configuration in FIG. 41 has the advantage of maintaining the chip 1010 enclosed within the inlay 1000, with the thinned portion 1034 of the antenna substrate 1004 helping protect the chip 1010 from physical damage and/or contaminants. The use of a recess 1030 instead of the hole 1012 (FIG. 40) may be especially attractive for devices employing thin chips. As an example, the chip 1010 may have a thickness of about 120 microns or less, which may be achieved using chemical or mechanical grinding. With such grinding, the chip 1010 may have a thickness as low as about 20 to 30 microns.

It will be appreciated that the hole 1012 (FIG. 40) or the recess (FIG. 41) may be suitably sized to allow for some mis-registry of the chip 1010. For example, the hole 1012 or the recess 1030 may sized about 1 mm larger than the chip 1010 that is to be placed in the hole 1012 or the recess 1030. Space between the chip 1010 and the hole 1012 or the recess 1030 may be filled with a suitable dielectric filler material.

The hole 1012 or the recess 1030 may be formed either before or after formation of the antenna 1004 on the antenna substrate 1004. The hole 1012 may be formed by punching or die cutting, for instance. The recess 1030 may be formed by a suitable embossing process.

Figure 42:
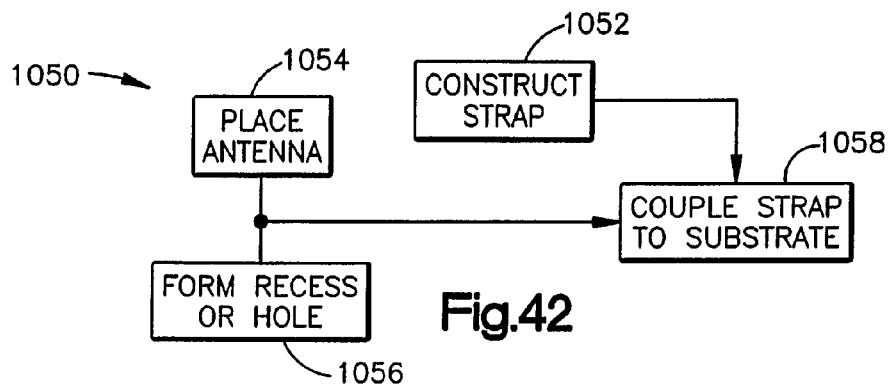
FIG. 42 is a high-level flow chart showing steps in the making of the inlays of FIGS. 40 and 41.

FIG. 42 shows a high-level flowchart for steps a method 1050 of producing the construction of the inlays 1000 shown in FIGS. 40 and 41. In step 1052 the interposer or strap 1008 is constructed by coupling the chip 1010 to the interposer leads 1016. In step 1054 the antenna 1006 is formed or placed on the antenna substrate 1004, while in step 1056 the hole 1012 (FIG. 40) or the recess 1030 (FIG. 41) is formed in the antenna substrate 1004. The steps 1054 and 1056 may be performed in either order, and may be performed before or after the construction of the interposer 1008 in step 1052. Finally, in step 1058 the interposer 1008 is coupled to the antenna substrate 1004. This may be done by placing the interposer 1008 face down upon the antenna substrate 1004, such that at least part of the chip 1010 is in the hole 1012 or the recess 1030, and coupling the interposer leads 1016 to the antenna 1006.

Figure 43:
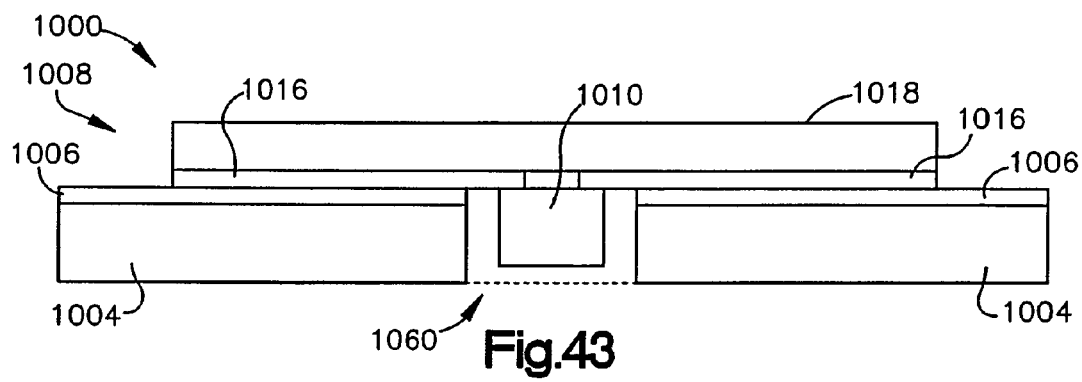
FIGS. 43 and 44 are cross-sectional views of one embodiment of an RFID inlay of the present invention, which has a variable dimension hole.
Figure 44:
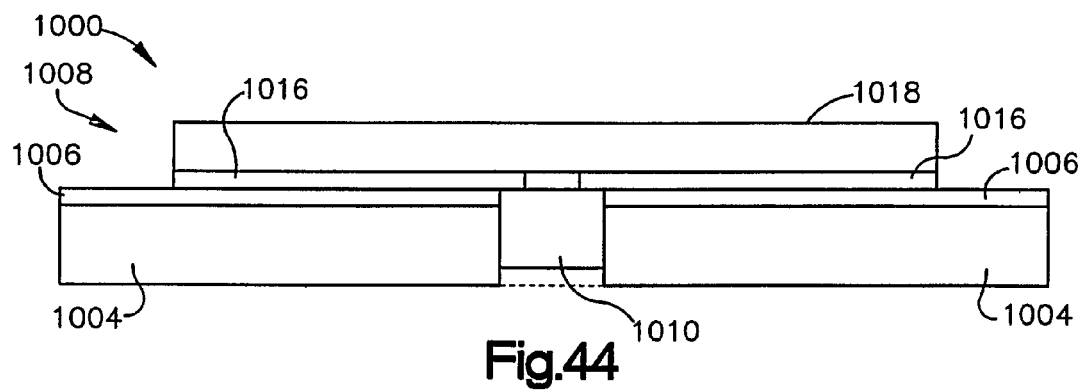

FIGS. 43 and 44 show an alternate embodiment of the inlay 1000, which has a variable-dimension hole 1060 in the antenna substrate 1004. As shown in FIG. 43, the hole 1060 may be expanded, such as by heating, in order to receive at least part of the chip 1010 of the interposer 1008. After the chip 1010 is inserted into the variable-dimension hole 1060, the dimensions of the hole 1060 may be reduced to clamp or secure the chip 1010 in place. The reduction of the dimensions of the hole 1060 may be accomplished by cooling the antenna substrate 1004, or by letting the heated substrate cool.

The clamping of the chip 1010 within the variable-dimension hole 1060 may be used as an alternative to or in addition to use of adhesives to secure the interposer 1008 to the antenna 1006 and antenna substrate 1004. It will be appreciated that the clamping of the chip 1010 in the variable-dimension hole 1060 may be reversible. That is, the hole 1060 may be re-expanded to the condition shown in FIG. 43, to release the clamping or other mechanical securing of the chip 1010.

As discussed above, heating and cooling may be used to change the dimension of the variable-dimension hole 1060. Heating may be provided by any of a variety suitable methods, and the heating may be local or global. Alternatives to heating may also be used, such as by application of mechanical force or by use of a suitable material that contracts when exposed to UV light.

Figure 45:
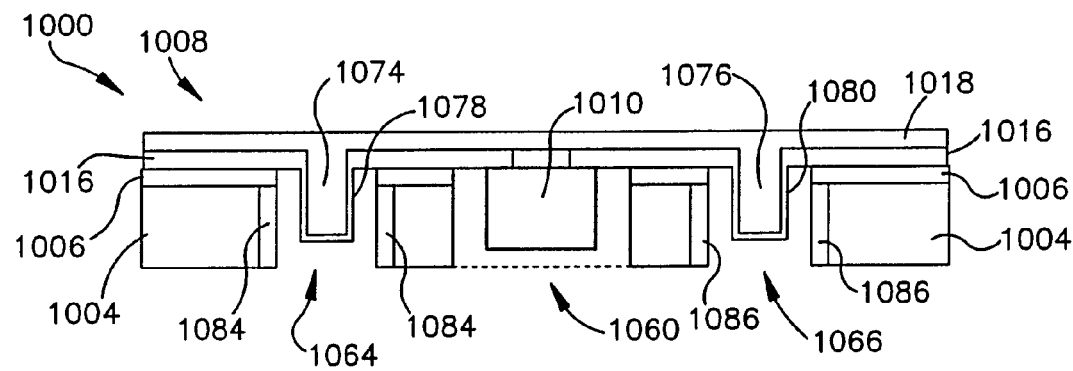
FIGS. 45 and 46 are cross-sectional views of another embodiment of an RFID inlay of the present invention, which has a variable dimension hole.
Figure 46:
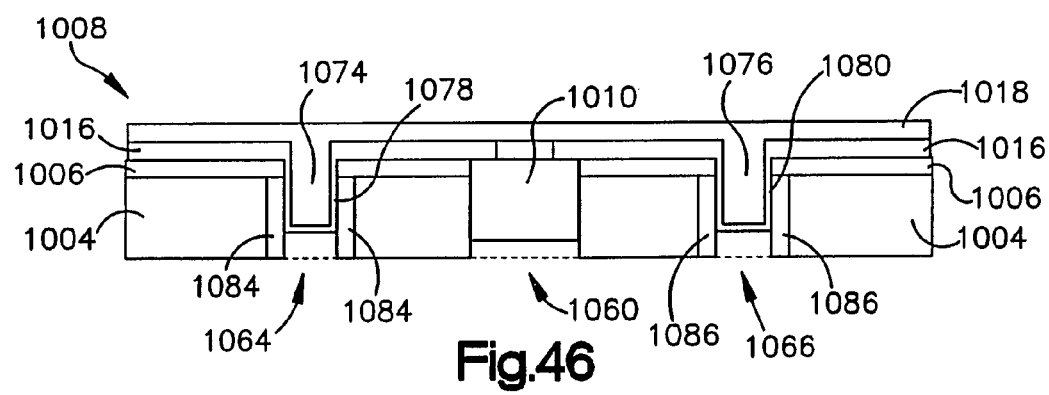

FIGS. 45 and 46 show another alternative embodiment of the inlay 1000, wherein the variable-dimension hole 1060 that receives the chip 1010 is flanked by a pair of additional variable-dimension holes 1064 and 1066. The holes 1064 and 1066 may be configured to clamp and secure conductive-material-coated posts 1074 and 1076 of the interposer 1008. The posts 1074 and 1076 may be inserted into the holes 1064 and 1066, as shown in FIG. 45, and may be secured within the holes 1064 and 1066, as shown in FIG. 46, by reducing the dimensions of the holes 1064 and 1066.

The holes 1064 and 1066 may be configured to draw the posts 1074 and 1076 into the holes 1064 and 1066 as the dimensions of the holes 1064 and 1066 are reduced. This may provide enough force to maintain contact between the interposer 1008 and the substrate 1004 so as to electrically couple together the interposer leads 1016 and portions of the antenna 1006. The interposer leads 1016 may have portions 1078 and 1080 on the posts 1074 and 1076, to facilitate electrical coupling of the interposer leads 1016 and the antenna 1006. The coupling between the interposer leads 1016 and the antenna 1006 may be capacitive and/or conductive.

The edges or boundaries 1084 and 1086 of the holes 1064 and 1066 may be coated with conductive material. The conductive material on the edges or boundaries 1084 and 1086 of the holes 1064 and 1066 may aid in making conductive contact between the interposer leads 1016 and the antenna 1006.

The use of the holes 1060, 1064, and 1066 to couple the interposer 1008 and the substrate 1004 together may have the advantage of making the coupling reversible. This may allow testing of the interposer 1008 in combination with the antenna 1006 prior to permanent coupling of the interposer 1008 and the antenna 1006 together. It will be appreciated that such testing may allow a faulty interposer to be detected and replaced, without a need to discard a good antenna portion of an inlay.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making a radio frequency identification (RFID) device, the method comprising:
   placing an antenna on a substrate in a roll to roll process;
   providing dielectric pads that have a dielectric constant that is a non-constant function of the thickness of the dielectric pads; and
   capacitively coupling a chip that is part of an interposer having interposer leads to the antenna with the dielectric pads positioned between the interposer leads and the antenna.

2. The method of claim 1, wherein the capacitively coupling includes capacitively coupling the interposer leads to the antenna.

3. The method of claim 2, wherein the capacitively coupling includes mechanically coupling the interposer leads to the antenna with dielectric pads between the interposer leads and the antenna.

4. The method of claim 3, wherein dielectric pads include a pressure sensitive adhesive, and wherein the mechanical coupling includes pressing the interposer and the antenna together.

5. The method of claim 1, wherein the capacitively coupling includes capacitively coupling the interposer leads to the chip.

6. A method of making a radio frequency identification (RFID) device, the method comprising:
    placing an antenna on a substrate;
    providing a strap, the strap having a chip and conducive leads;
    placing a dielectric layer between the conductive leads and the antenna; and
    self-compensating capacitively coupling the strap to the antenna with the dielectric layer between the conductive leads and the antenna.

7. The method of claim 6, wherein the conductive leads are tapered.

8. The method of claim 6, wherein the dielectric layer has a dielectric constant that is a non-constant function of thickness.

9. The method of claim 8, wherein the dielectric layer includes one of dielectric adhesives and non-conductive polymers.

10. The method of claim 6, wherein the RFID device is one of a RFID inlay, tag or label.

11. The method of claim 10, wherein the RFID device includes a label facestock and an adhesive layer.

12. The method of claim 6, wherein the method is used in a roll-to-roll process.

13. The method of claim 6, including a further step of placing an adhesive on the dielectric layer prior to the step of placing the dielectric layer.

14. The method of claim 6, including a further step of determining a thickness of the dielectric layer based impedance matching between the interposer and antenna, prior to the step of placing the dielectric layer.

15. The method of claim 6, wherein the conductive leads have reduced conductive material portions.

16. The method of claim 15, wherein the reduced conductive material portions have apertures, gaps or openings.

17. A method for making a radio frequency identification (RFID) device, the method comprising:
    placing an antenna on a substrate;
    providing a conductive interposer, the conductive interposer having a chip and conducive leads in which a portion of the conductive leads are tapered;
    placing a dielectric layer between the tapered portions of the conductive leads and the antenna; and
    capacitively coupling the strap to the antenna with the dielectric layer between the conductive leads and the antenna.

18. The method of claim 17, wherein the dielectric layer has a plurality of particles dispersed in the dielectric layer.

19. The method of claim 18, wherein the dielectric layer has a dielectric constant and the plurality of particles affect the dielectric constant.

* * * * *